(12) United States Patent
Xu et al.

(10) Patent No.: US 7,122,079 B2
(45) Date of Patent: Oct. 17, 2006

(54) COMPOSITION FOR AN ETCHING MASK COMPRISING A SILICON-CONTAINING MATERIAL

(75) Inventors: Frank Y. Xu, Austin, TX (US); Michael N. Miller, Austin, TX (US); Michael P. C. Watts, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 10/789,319

(22) Filed: Feb. 27, 2004

(65) Prior Publication Data

US 2005/0192421 A1 Sep. 1, 2005

(51) Int. Cl.
*C08L 83/00* (2006.01)

(52) U.S. Cl. .................. 106/287.12; 524/356; 524/588; 528/23; 528/29; 528/34

(58) Field of Classification Search .............................. 106/287.1–287.16; 428/447–452; 528/17, 18
See application file for complete search history.

(56) References Cited

U.S. PATENT DOCUMENTS

| | | |
|---|---|---|
| 3,527,062 A | 9/1970 | Belinski et al. |
| 3,783,520 A | 1/1974 | King |
| 3,807,027 A | 4/1974 | Heisler |
| 3,807,029 A | 4/1974 | Troeger |
| 3,810,874 A | 5/1974 | Mitsch et al. |
| 3,811,665 A | 5/1974 | Seelig |
| 4,062,600 A | 12/1977 | Wyse |
| 4,070,116 A | 1/1978 | Frosch et al. |
| 4,098,001 A | 7/1978 | Watson |
| 4,119,688 A | 10/1978 | Hiraoka |
| 4,155,169 A | 5/1979 | Drake et al. |
| 4,201,800 A | 5/1980 | Alcorn et al. |
| 4,202,107 A | 5/1980 | Watson |
| 4,267,212 A | 5/1981 | Sakawaki |
| 4,326,805 A | 4/1982 | Feldman et al. |
| 4,337,579 A | 7/1982 | De Fazio |
| 4,355,469 A | 10/1982 | Nevins et al. |
| 4,414,750 A | 11/1983 | De Fazio |
| 4,426,247 A | 1/1984 | Tamamura et al. |
| 4,440,804 A | 4/1984 | Milgram |
| 4,451,507 A | 5/1984 | Beltz et al. |
| 4,507,331 A | 3/1985 | Hiraoka |
| 4,512,848 A | 4/1985 | Deckman et al. |
| 4,517,337 A * | 5/1985 | Lockhart et al. ............ 524/859 |
| 4,544,572 A | 10/1985 | Sandvig et al. |
| 4,552,832 A | 11/1985 | Blume et al. |
| 4,552,833 A | 11/1985 | Ito et al. |
| 4,600,309 A | 7/1986 | Fay |
| 4,610,442 A | 9/1986 | Oku et al. |
| 4,614,667 A | 9/1986 | Larson et al. |
| 4,617,238 A | 10/1986 | Crivello et al. |
| 4,657,845 A | 4/1987 | Frechet et al. |
| 4,692,205 A | 9/1987 | Sachdev et al. |
| 4,694,703 A | 9/1987 | Routson |
| 4,707,218 A | 11/1987 | Giammarco et al. |
| 4,724,222 A | 2/1988 | Feldman |
| 4,731,155 A | 3/1988 | Napoli et al. |
| 4,737,425 A | 4/1988 | Lin et al. |
| 4,763,886 A | 8/1988 | Takei |
| 4,772,878 A | 9/1988 | Kane |
| 4,808,511 A | 2/1989 | Holmes |
| 4,826,943 A | 5/1989 | Ito et al. |
| 4,846,931 A | 7/1989 | Gmitter et al. |
| 4,848,179 A | 7/1989 | Ubhayakar |
| 4,848,911 A | 7/1989 | Uchida et al. |
| 4,857,477 A | 8/1989 | Kanamori |
| 4,883,561 A | 11/1989 | Gmitter et al. |
| 4,887,283 A | 12/1989 | Hosno |
| 4,891,303 A | 1/1990 | Garza et al. |
| 4,908,298 A | 3/1990 | Hefferon et al. |
| 4,909,151 A | 3/1990 | Fukui et al. |
| 4,919,748 A | 4/1990 | Bredbenner et al. |
| 4,921,778 A | 5/1990 | Thackeray et al. |
| 4,929,083 A | 5/1990 | Brunner |
| 4,931,351 A | 6/1990 | McColgin et al. |
| 4,959,252 A | 9/1990 | Bonnebat et al. |
| 4,964,145 A | 10/1990 | Maldonado |

(Continued)

FOREIGN PATENT DOCUMENTS

DE 2800476 7/1978

(Continued)

OTHER PUBLICATIONS

MSDS for Dow Corning Z-6018 intermediate.*

(Continued)

*Primary Examiner*—Marc S. Zimmer
(74) *Attorney, Agent, or Firm*—Kelly Kordzik; Edward T. Mickelson; Winstead Sechrest & Minick P.C.

(57) ABSTRACT

The present invention includes a composition for a silicon-containing material used as an etch mask for underlying layers. More specifically, the silicon-containing material may be used as an etch mask for a patterned imprinted layer comprising protrusions and recessions. To that end, in one embodiment of the present invention, the composition includes a hydroxyl-functional silicone component, a cross-linking component, a catalyst component, and a solvent. This composition allows the silicon-containing material to selectively etch the protrusions and the segments of the patterned imprinting layer in superimposition therewith, while minimizing the etching of the segments in superposition with the recessions, and therefore allowing an in-situ hardened mask to be created by the silicon-containing material, with the hardened mask and the patterned imprinting layer forming a substantially planarized profile.

5 Claims, 7 Drawing Sheets

U.S. PATENT DOCUMENTS

| | | |
|---|---|---|
| 4,964,945 A | 10/1990 | Calhoun et al. |
| 4,976,818 A | 12/1990 | Hashimoto et al. |
| 4,980,316 A | 12/1990 | Huebner |
| 4,999,280 A | 3/1991 | Hiraoka |
| 5,028,366 A | 7/1991 | Harakal et al. |
| 5,053,318 A | 10/1991 | Gulla et al. |
| 5,063,321 A | 11/1991 | Carter |
| 5,071,694 A | 12/1991 | Uekita et al. |
| 5,072,126 A | 12/1991 | Progler |
| 5,073,230 A | 12/1991 | Maracas et al. |
| 5,074,667 A | 12/1991 | Miyatake |
| 5,108,875 A | 4/1992 | Thackeray et al. |
| 5,110,514 A | 5/1992 | Soane |
| 5,126,006 A | 6/1992 | Cronin et al. |
| 5,148,036 A | 9/1992 | Matsugu et al. |
| 5,148,037 A | 9/1992 | Suda et al. |
| 5,151,754 A | 9/1992 | Ishibashi et al. |
| 5,155,749 A | 10/1992 | DiMilia et al. |
| 5,169,494 A | 12/1992 | Hashimoto et al. |
| 5,171,490 A | 12/1992 | Fudim |
| 5,173,393 A | 12/1992 | Sezi et al. |
| 5,179,863 A | 1/1993 | Uchida et al. |
| 5,198,326 A | 3/1993 | Hashimoto et al. |
| 5,204,739 A | 4/1993 | Domenicali |
| 5,206,983 A | 5/1993 | Guckel et al. |
| 5,212,147 A | 5/1993 | Sheats |
| 5,218,193 A | 6/1993 | Miyatake |
| 5,234,793 A | 8/1993 | Sebald et al. |
| 5,240,550 A | 8/1993 | Boehnke et al. |
| 5,240,878 A | 8/1993 | Fitzsimmons et al. |
| 5,242,711 A | 9/1993 | DeNatale et al. |
| 5,244,818 A | 9/1993 | Jokerst et al. |
| 5,259,926 A | 11/1993 | Kuwabara et al. |
| 5,270,984 A | 12/1993 | Mine |
| 5,277,749 A | 1/1994 | Griffith et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,331,020 A | 7/1994 | Brown et al. |
| 5,348,616 A | 9/1994 | Hartman et al. |
| 5,355,219 A | 10/1994 | Araki et al. |
| 5,357,122 A | 10/1994 | Okubora et al. |
| 5,362,606 A | 11/1994 | Hartney et al. |
| 5,366,851 A | 11/1994 | Novembre |
| 5,374,454 A | 12/1994 | Bickford et al. |
| 5,376,810 A | 12/1994 | Hoenk et al. |
| 5,380,474 A | 1/1995 | Rye et al. |
| 5,389,696 A | 2/1995 | Dempsey et al. |
| 5,392,123 A | 2/1995 | Marcus et al. |
| 5,414,514 A | 5/1995 | Smith et al. |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,425,848 A | 6/1995 | Haisma et al. |
| 5,425,964 A | 6/1995 | Southwell et al. |
| 5,431,777 A | 7/1995 | Austin |
| 5,439,766 A | 8/1995 | Day et al. |
| 5,452,090 A | 9/1995 | Progler et al. |
| 5,453,157 A | 9/1995 | Jeng |
| 5,458,520 A | 10/1995 | DeMercurio et al. |
| 5,468,542 A | 11/1995 | Crouch |
| 5,480,047 A | 1/1996 | Tanigawa et al. |
| 5,504,793 A | 4/1996 | Chen |
| 5,507,411 A | 4/1996 | Peckels |
| 5,508,527 A | 4/1996 | Kuroda et al. |
| 5,512,131 A | 4/1996 | Kumar et al. |
| 5,515,167 A | 5/1996 | Ledger et al. |
| 5,523,878 A | 6/1996 | Wallace et al. |
| 5,527,662 A | 6/1996 | Hashimoto et al. |
| 5,542,978 A | 8/1996 | Kindt-Larsen et al. |
| 5,545,367 A | 8/1996 | Bae et al. |
| 5,563,702 A | 10/1996 | Emery et al. |
| 5,566,584 A | 10/1996 | Briganti |
| 5,594,042 A | 1/1997 | Glover et al. |
| 5,601,641 A | 2/1997 | Stephens |
| 5,629,095 A | 5/1997 | Bujanowski et al. |
| 5,633,505 A | 5/1997 | Chung et al. |
| 5,654,238 A | 8/1997 | Cronin et al. |
| 5,669,303 A | 9/1997 | Maracas et al. |
| 5,670,415 A | 9/1997 | Rust |
| 5,700,626 A | 12/1997 | Lee et al. |
| 5,723,176 A | 3/1998 | Keyworth et al. |
| 5,724,145 A | 3/1998 | Kondo et al. |
| 5,725,788 A | 3/1998 | Maracas et al. |
| 5,726,548 A | 3/1998 | Chiba et al. |
| 5,731,981 A | 3/1998 | Simard |
| 5,736,424 A | 4/1998 | Prybyla et al. |
| 5,737,064 A | 4/1998 | Inoue et al. |
| 5,743,998 A | 4/1998 | Park |
| 5,747,102 A | 5/1998 | Smith et al. |
| 5,753,014 A | 5/1998 | Van Rijn |
| 5,760,500 A | 6/1998 | Kondo et al. |
| 5,772,905 A | 6/1998 | Chou |
| 5,776,748 A | 7/1998 | Singhvi et al. |
| 5,779,799 A | 7/1998 | Davis |
| 5,785,918 A | 7/1998 | Hull |
| 5,802,914 A | 9/1998 | Fassler et al. |
| 5,804,474 A | 9/1998 | Sakaki et al. |
| 5,808,742 A | 9/1998 | Everett et al. |
| 5,825,482 A | 10/1998 | Nikoonahadetal |
| 5,837,314 A | 11/1998 | Beaton et al. |
| 5,849,209 A | 12/1998 | Kindt-Larsen et al. |
| 5,849,222 A | 12/1998 | Jen et al. |
| 5,855,686 A | 1/1999 | Rust |
| 5,861,467 A | 1/1999 | Bujanowski et al. |
| 5,876,550 A | 3/1999 | Feygin et al. |
| 5,877,036 A | 3/1999 | Kawai |
| 5,877,861 A | 3/1999 | Ausschnitt et al. |
| 5,884,292 A | 3/1999 | Baker et al. |
| 5,888,650 A | 3/1999 | Calhoun et al. |
| 5,895,263 A | 4/1999 | Carter et al. |
| 5,900,160 A | 5/1999 | Whitesides et al. |
| 5,905,104 A | 5/1999 | Eklund et al. |
| 5,907,782 A | 5/1999 | Wu |
| 5,912,049 A | 6/1999 | Shirley |
| 5,926,690 A | 7/1999 | Toprac et al. |
| 5,937,758 A | 8/1999 | Maracas et al. |
| 5,942,871 A | 8/1999 | Lee |
| 5,948,219 A | 9/1999 | Rohner |
| 5,948,470 A | 9/1999 | Harrison et al. |
| 5,948,570 A | 9/1999 | Kornblut et al. |
| 5,952,127 A | 9/1999 | Yamanaka |
| 5,988,859 A | 11/1999 | Kirk |
| 6,033,977 A | 3/2000 | Gutsche et al. |
| 6,035,805 A | 3/2000 | Rust |
| 6,036,055 A | 3/2000 | Mogadam et al. |
| 6,038,280 A | 3/2000 | Rossiger et al. |
| 6,039,897 A | 3/2000 | Lochhead et al. |
| 6,046,056 A | 4/2000 | Parce et al. |
| 6,051,345 A | 4/2000 | Huang |
| 6,074,827 A | 6/2000 | Nelson et al. |
| 6,081,334 A | 6/2000 | Brimbergen et al. |
| 6,088,103 A | 7/2000 | Everett et al. |
| 6,091,485 A | 7/2000 | Li et al. |
| 6,096,655 A | 8/2000 | Lee et al. |
| 6,117,708 A | 9/2000 | Wensel |
| 6,125,183 A | 9/2000 | Jiawook et al. |
| 6,128,085 A | 10/2000 | Buermann et al. |
| 6,133,576 A | 10/2000 | Shafer et al. |
| 6,137,562 A | 10/2000 | Masuyuki et al. |
| 6,143,412 A | 11/2000 | Schueller et al. |

| Patent No. | Date | Inventor |
|---|---|---|
| 6,150,231 A | 11/2000 | Muller et al. |
| 6,150,680 A | 11/2000 | Eastman et al. |
| 6,168,845 B1 | 1/2001 | Fontana, Jr. et al. |
| 6,180,239 B1 | 1/2001 | Whitesides et al. |
| 6,182,042 B1 | 1/2001 | Peevers |
| 6,188,150 B1 | 2/2001 | Spence |
| 6,204,343 B1 | 3/2001 | Barucha et al. |
| 6,204,922 B1 | 3/2001 | Chalmers |
| 6,218,316 B1 | 4/2001 | Marsh |
| 6,234,379 B1 | 5/2001 | Donges |
| 6,245,213 B1 | 6/2001 | Olsson et al. |
| 6,245,581 B1 | 6/2001 | Bonser et al. |
| 6,274,294 B1 | 8/2001 | Hines |
| 6,309,580 B1 | 10/2001 | Chou |
| 6,316,290 B1 | 11/2001 | Wensel |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,342,097 B1 | 1/2002 | Terry et al. |
| 6,355,198 B1 | 3/2002 | Kim et al. |
| 6,361,831 B1 | 3/2002 | Sato et al. |
| 6,383,928 B1 | 5/2002 | Eissa |
| 6,387,783 B1 | 5/2002 | Furukawa et al. |
| 6,387,787 B1 | 5/2002 | Mancini et al. |
| 6,388,253 B1 | 5/2002 | Su |
| 6,391,217 B1 | 5/2002 | Schaffer et al. |
| 6,391,798 B1 | 5/2002 | DeFelice et al. |
| 6,407,340 B1 | 6/2002 | Wikstrom et al. |
| 6,411,010 B1 | 6/2002 | Suzuki et al. |
| 6,420,892 B1 | 7/2002 | Krivy et al. |
| 6,423,207 B1 | 7/2002 | Heidari et al. |
| 6,437,891 B1 | 8/2002 | Chandrasekhar et al. |
| 6,447,919 B1 | 9/2002 | Brown et al. |
| 6,455,411 B1 | 9/2002 | Jiang et al. |
| 6,467,761 B1 | 10/2002 | Amatucci et al. |
| 6,468,642 B1 | 10/2002 | Bray et al. |
| 6,468,896 B1 | 10/2002 | Rohr et al. |
| 6,482,742 B1 | 11/2002 | Chou |
| 6,489,068 B1 | 12/2002 | Kye |
| 6,495,624 B1 | 12/2002 | Brown |
| 6,503,914 B1 | 1/2003 | Benish et al. |
| 6,514,672 B1 | 2/2003 | Young et al. |
| 6,517,977 B1 | 2/2003 | Resnick et al. |
| 6,517,995 B1 | 2/2003 | Jacobenson et al. |
| 6,518,168 B1 | 2/2003 | Clem et al. |
| 6,518,189 B1 | 2/2003 | Chou |
| 6,521,324 B1 | 2/2003 | Debe et al. |
| 6,522,411 B1 | 2/2003 | Moon et al. |
| 6,534,418 B1 | 3/2003 | Plat et al. |
| 6,539,286 B1 | 3/2003 | Jiang |
| 6,541,356 B1 | 4/2003 | Seshan |
| 6,541,360 B1 | 4/2003 | Plat et al. |
| 6,544,594 B1 | 4/2003 | Linford et al. |
| 6,561,706 B1 | 5/2003 | Singh et al. |
| 6,565,776 B1 | 5/2003 | Li et al. |
| 6,565,928 B1 | 5/2003 | Sakamoto et al. |
| 6,580,172 B1 | 6/2003 | Mancini et al. |
| 6,580,505 B1 | 6/2003 | Bareket |
| 6,588,632 B1 | 7/2003 | Nicol |
| 6,600,969 B1 | 7/2003 | Sudolcan et al. |
| 6,632,742 B1 | 10/2003 | Yang et al. |
| 6,633,391 B1 | 10/2003 | Oluseyi et al. |
| 6,635,581 B1 | 10/2003 | Wong |
| 6,646,662 B1 | 11/2003 | Nebashi et al. |
| 6,649,272 B1 | 11/2003 | Moore et al. |
| 6,664,306 B1 | 12/2003 | Gaddam et al. |
| 6,677,252 B1 | 1/2004 | Marsh |
| 6,696,157 B1 | 2/2004 | David et al. |
| 6,696,220 B1 | 2/2004 | Bailey et al. |
| 6,703,190 B1 | 3/2004 | Elian et al. |
| 6,713,238 B1 | 3/2004 | Chou et al. |
| 6,716,767 B1 | 4/2004 | Shih et al. |
| 6,719,915 B1 | 4/2004 | Willson et al. |
| 6,721,529 B1 | 4/2004 | Chen et al. |
| 6,730,256 B1 | 5/2004 | Bloomstein et al. |
| 6,737,202 B1 | 5/2004 | Gehoski et al. |
| 6,737,489 B1 | 5/2004 | Linert et al. |
| 6,743,713 B1 | 6/2004 | Mukherjee-Roy et al. |
| 6,753,972 B1 | 6/2004 | Hirose et al. |
| 6,767,983 B1 | 7/2004 | Fujiyama et al. |
| 6,770,852 B1 | 8/2004 | Steger |
| 6,774,183 B1 | 8/2004 | Palumbo et al. |
| 6,776,094 B1 | 8/2004 | Whitesides et al. |
| 6,777,170 B1 | 8/2004 | Bloomstein et al. |
| 6,790,905 B1 | 9/2004 | Fitzgerald et al. |
| 6,802,870 B1 | 10/2004 | Chang et al. |
| 6,805,054 B1 | 10/2004 | Meissl et al. |
| 6,809,356 B1 | 10/2004 | Chou |
| 6,828,244 B1 | 12/2004 | Chou |
| 6,830,819 B1 | 12/2004 | Kaplan et al. |
| 2001/0023829 A1 | 9/2001 | Olsson et al. |
| 2001/0040145 A1 | 11/2001 | Willson et al. |
| 2001/0044075 A1 | 11/2001 | Nishimura et al. |
| 2002/0042027 A1 | 4/2002 | Chou et al. |
| 2002/0069525 A1 | 6/2002 | Hada et al. |
| 2002/0093122 A1 | 7/2002 | Choi et al. |
| 2002/0094496 A1 | 7/2002 | Choi et al. |
| 2002/0098426 A1 | 7/2002 | Sreenivasan et al. |
| 2002/0132482 A1 | 9/2002 | Chou |
| 2002/0150398 A1 | 10/2002 | Choi et al. |
| 2002/0167117 A1 | 11/2002 | Chou |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kando et al. |
| 2003/0113638 A1 | 6/2003 | Mancini et al. |
| 2003/0129542 A1 | 7/2003 | Shih et al. |
| 2003/0133126 A1 | 7/2003 | Sarfaly et al. |
| 2003/0179354 A1 | 9/2003 | Araki et al. |
| 2003/0205657 A1 | 11/2003 | Voisin |
| 2003/0205658 A1 | 11/2003 | Voisin |
| 2003/0215577 A1 | 11/2003 | Willson et al. |
| 2003/0235787 A1 | 12/2003 | Watts et al. |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0010341 A1 | 1/2004 | Watts et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0036201 A1 | 2/2004 | Chou et al. |
| 2004/0038552 A1 | 2/2004 | Watts et al. |
| 2004/0046271 A1 | 3/2004 | Watts |
| 2004/0046288 A1 | 3/2004 | Chou |
| 2004/0053146 A1 | 3/2004 | Sreenivasan et al. |
| 2004/0065252 A1 | 4/2004 | Sreenivasan et al. |
| 2004/0065976 A1 | 4/2004 | Sreenivasan et al. |
| 2004/0086793 A1 | 5/2004 | Sreenivasan et al. |
| 2004/0089979 A1 | 5/2004 | Rubin |
| 2004/0090611 A1 | 5/2004 | Choi et al. |
| 2004/0104641 A1 | 6/2004 | Choi et al. |
| 2004/0110856 A1 | 6/2004 | Young et al. |
| 2004/0112153 A1 | 6/2004 | Choi et al. |
| 2004/0112861 A1 | 6/2004 | Choi et al. |
| 2004/0112862 A1 | 6/2004 | Willson et al. |
| 2004/0116548 A1 | 6/2004 | Willson et al. |
| 2004/0118809 A1 | 6/2004 | Chou et al. |
| 2004/0122862 A1 | 6/2004 | Willson et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0141163 A1 | 7/2004 | Bailey et al. |

| | | | | | | |
|---|---|---|---|---|---|---|
| 2004/0141168 | A1 | 7/2004 | Sreenivasan et al. | WO | WO 2004/034424 | 4/2004 |
| 2004/0146792 | A1 | 7/2004 | Nimmakayala et al. | WO | WO 2004/044651 | 5/2004 |
| 2004/0149687 | A1 | 8/2004 | Choi et al. | WO | WO 2004/054784 | 7/2004 |
| 2004/0150129 | A1 | 8/2004 | Hougham et al. | WO | WO 2004/055594 | 7/2004 |
| 2004/0156108 | A1 | 8/2004 | Chou et al. | WO | WO 2004/063815 | 7/2004 |
| 2004/0163563 | A1 | 8/2004 | Sreenivasan et al. | WO | WO 2004/114016 | 12/2004 |
| 2004/0168586 | A1 | 9/2004 | Bailey et al. | | | |
| 2004/0168588 | A1 | 9/2004 | Choi et al. | | | |
| 2004/0168613 | A1 | 9/2004 | Nguyen | | | |
| 2004/0169441 | A1 | 9/2004 | Choi et al. | | | |
| 2004/0170770 | A1 | 9/2004 | Nguyen | | | |
| 2004/0170771 | A1 | 9/2004 | Bailey et al. | | | |
| 2004/0188381 | A1 | 9/2004 | Sreenivasan et al. | | | |
| 2004/0189994 | A1 | 9/2004 | Sreenivasan et al. | | | |
| 2004/0189996 | A1 | 9/2004 | Sreenivasan et al. | | | |
| 2004/0192041 | A1 | 9/2004 | Jeong et al. | | | |
| 2004/0197843 | A1 | 10/2004 | Chou et al. | | | |
| 2004/0200411 | A1 | 10/2004 | Willson et al. | | | |
| 2004/0202865 | A1 | 10/2004 | Homola et al. | | | |
| 2004/0202872 | A1 * | 10/2004 | Fang et al. ................ 428/447 | | | |
| 2004/0209177 | A1 | 10/2004 | Sreenivasan et al. | | | |
| 2004/0211754 | A1 | 10/2004 | Sreenivasan | | | |
| 2004/0241338 | A1 * | 12/2004 | Foster et al. ................ 427/487 | | | |
| 2004/0251775 | A1 | 12/2004 | Choi et al. | | | |

FOREIGN PATENT DOCUMENTS

| | | |
|---|---|---|
| DE | 19648844 | 9/1997 |
| EP | 244884 | 3/1987 |
| EP | 733455 | 9/1996 |
| EP | 803 555 A2 * | 4/1997 |
| EP | 0867775 | 9/1998 |
| JP | 55-88332 | 7/1980 |
| JP | 57-7931 | 1/1982 |
| JP | 58-129074 | 8/1983 |
| JP | 63-138730 | 6/1988 |
| JP | 1-196749 | 8/1989 |
| JP | 02-24848 | 1/1990 |
| JP | 02-92603 | 4/1990 |
| JP | 02192045 | 7/1990 |
| JP | 2-219881 A * | 9/1990 |
| JP | 4-70379 | 5/1992 |
| WO | WO 87/02935 | 5/1987 |
| WO | WO 92/17883 | 10/1992 |
| WO | WO 98/10121 | 3/1998 |
| WO | WO 99/05724 | 2/1999 |
| WO | WO 99/45753 | 9/1999 |
| WO | WO 99/63535 | 12/1999 |
| WO | WO 00/21689 | 4/2000 |
| WO | WO 00/54107 | 9/2000 |
| WO | WO 01/33232 | 5/2001 |
| WO | WO 01/33300 | 5/2001 |
| WO | WO 01/47003 A2 | 6/2001 |
| WO | WO 01/53889 | 7/2001 |
| WO | WO 01/63361 | 8/2001 |
| WO | WO 01/69317 | 9/2001 |
| WO | WO 01/79589 | 10/2001 |
| WO | WO 01/79591 | 10/2001 |
| WO | WO 01/79592 | 10/2001 |
| WO | WO 01/79933 | 10/2001 |
| WO | WO 01/90816 | 11/2001 |
| WO | WO 02/006902 | 1/2002 |
| WO | WO 02/07199 | 1/2002 |
| WO | WO 02/008835 | 1/2002 |
| WO | WO 02/17383 | 2/2002 |
| WO | WO 02/22916 | 3/2002 |
| WO | WO 02/24977 | 3/2002 |
| WO | WO 02/067055 | 8/2002 |
| WO | WO 03/010289 | 2/2003 |
| WO | WO 03/079416 | 9/2003 |
| WO | WO 03/099536 | 12/2003 |
| WO | WO 2004/006120 | 1/2004 |
| WO | WO 2004/016406 | 2/2004 |

OTHER PUBLICATIONS

U.S. Appl. No. 10/948,511, filed Sep. 23, 2004, Xu et al.
U.S. Appl. No. 10/967,740, filed Oct 18, 2004, Xu et al.
U.S. Appl. No. 10/919,062, filed Aug. 16, 2004, Xu et al.
Chou et al., Nanoimprint Lithography, Journal of Vacuum Science Technolgoy B 14(16), pp. 4129-4133, Nov. 1, 1996.
Colburn et al., Development and Advantages of Step-and-Flash Lithography, Solid State Technology, Jul. 1, 2001.
Colburn et al., Characterization and Modeling of Volumetric and Mechanical Properties for Step and Flash Imprint Lithography Photopolymers, Journal of Vacuum Science Technology. Vol b. 19(6), Nov. 1, 2001.
Yu et al., Properties of Fluorinated Amorphous Diamond Like Carbon Films by PECVD, Applied Surface Science 219 (3-4); pp. 228-237, Dec. 1, 2003.
Compon et al., Electroanalysis at Diamond-Like and Doped-Diamond Electrodes, Electroanalysis 15(17); pp. 1349-1363, Sep. 1, 2003.
Mansano et al., Protective Carbon Layer for Chemical Corrosion of Stainless Steel, Diamond and Related Materials 12 (3-7); pp. 749-752, Mar. 1, 2003.
Butter et al., Production and Wetting Properties of Fluorinated Diamond-Like Carbon Coatings, Thin Solid Films, 311(1-2); pp. 107-113, Dec. 31, 1997.
Hakovirta et al., Heat Resistance of Fluorinated Diamond-Like Carbon Films, Diamond and Related Materiasl 10(8); pp. 1486-1490, Aug. 1, 2001.
Zhu et al., The Improvement of the Oxidation Resistance of TiAl Alloys by Fluorine Plasma-Based Ion Implantation, Surface and Coatings Technology 158; pp. 502-507, Sep. 1, 2002.
Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178, Apr. 17, 2004.
Bailey et al., Step and Flash Imprint Lithography: Defect Analysis, Journal of Vacuum Science, B 19(6), pp. 2806-2810, Nov. 1, 2001.
Bailey et al., Step and Flash Imprint Lithography: Template Surface Treatment and Defect Analysis, Journal of Vacuum Science, B 18(6), pp. 3572-3577, Nov. 1, 2000.
Schneider et al., Stripes of Partially Fluorinated Alkyl Chains: Dipolar Langmuir Monolayers.
Data Sheet for MAK (Methyl n-Amyl Ketone), www.sp-chem.com/fine_e, Jan. 1, 2003.
Data Sheet for gamma-Glycidoxypropyltrimethoxysilane, www.powerchemical.net/3100.htm, Dec. 5, 2003.
Silicon or Silica, www.mii.org/Minerals/photosil, Mar. 31, 2005.
Electronic Devices and Circuits, people.deas.harvard.edu/~jones/es154/lectures/lecture_2/materials/materials.html, Mar. 31, 2005.
Data Sheet for Cymel 303ULF, www.cytec.com, 12:00:00 AM.
Data Sheet for Cycat 4040, www.cytec.com, 12:00:00 AM.
International Chemical Safety Card for p-Toluenseulfonic Acid, www.itcilo.it/english/actrav/teleam/osh/ic/104154.htm, Dec. 5, 2003.
Data Sheet for p-Toluenesulfonic Acid, NIOSH Manual of Analytical Methods (NMAM), Fourth Edition, 12:00:00 AM.
Data Sheet for Dow Corning Z-6018, , 12:00:00 AM.
Data Sheet for Methyl Amyl Ketone, www.arb.ca.gov/db/solvents/solvent_pages/Ketones-HTML/methyl_amyl.htm, Mar. 31, 2005.
Abstract of Japanese Patent 02-24848, Jan. 26, 1990.
Abstract of Japanese Patent 02-92603, Aug. 12, 2004.
Abstract of Japanese Patent 55-88332, Apr. 14, 2004.
Abstract of Japanese Patent 57-7931, Apr. 14, 2004.
Abstract of Japanese Patent 58-129074, Aug. 1, 1983.
Abstract of Japanese Patent 63-138730, Apr. 14, 2004.

Ananthasuresh et al., "Strategies for Systematic Synthesis of Compliant Mems.", DSC-vol. 55-2, Dynamic Systems and Control: vol. 2, pp. 677-686, Nov. 1, 1994.

Arai et al., "Calibration and Basic Motion of Micro Hand Module.", IEEE, Jan. 1, 1993, pp. 1660-1665.

Arai et al., "Development of a New Parallel Manipulator with Fixed Linear Actuator.", In Proceedings of Japan/USA Symposium on Flexible Automation, Jan. 1, 1996, vol. 1, ASME, New York, pp. 145-149.

Armitage, "Analysis of Overlay Distortion Patterns.", Journal of Vacuum Science. B 20(6) pp. 2891-2895, Nov. 1, 2002.

Bender et al., "Fabrication of Nanostructures using a UV-based Imprint Technique.", Microelectronic Engineering 53, Jan. 1, 2000, pp. 233-236.

Bender et al., "Multiple Imprinting in UV-based Nanoimprint Lithography: Related Material Issues.", Microelectronic Engineering 61-62, Jan. 1, 2002, pp. 407-413.

Blomquist et al., "Fluorinated Acrylates in making Low-Loss, Low-Birefringence, and Single-Mode Optical Waveguides with Exceptional Thermo-Optic Properties.", SPIE Conference on Linear Optical Properties of Waveguides and Fibers, Jul. 1, 1999, vol. 3799, pp. 266-279.

Braeuer et al., "Precise Polymer Micro-Optical Systems.", MRS Bulletin, Jul. 1, 2001, pp. 519-522.

Chen et al., "Adaptive Alignment of Photomasks for Overlay Placement.", Journal of Vacuum Science. B20(6) pp. 3099-3105, Nov. 1, 2002.

Choi et al., "Design of Orientation Stages for Step and Flash Imprint Lithography.", Precision Engineering, Jan. 1, 2001, pp. 192-199.

Chou et al., "Imprint Lithography with 25-Nanometer Resolution." Science vol. 272, Apr. 5, 1996, pp. 85-87.

Chou et al., "Imprint Lithography with Sub-10 nm Feature Size and High Throughput.", Microelectronic Engineering 35, Jan. 1, 1997, pp. 237-240.

Chou et al., "Imprint of Sub-25 nm Vias and Trenches in Polymers.", Applied Physics Letter, Nov. 20, 1995, 67 (21).

Chou et al., "Lithographically Induced Self-assembly of Periodic Polymer Micropillar Arrays.", J. Vac. Sci. Technol., Nov. 1, 1999, B 17(6), pp. 3197-3202.

Chou et al., "Nanoimprint Lithography and Lithographically Induced Self-Assembly.", MRS Bulletin, Jul. 1, 2001, pp. 512-517.

Chou, Ultrafast and Direct Imprint of Nanostructures in Silicon, Nature, Col. 417, (Jun. 2002), pp. 835-837.

CIBA Specialty Chemicals, "What is UV Curing?", www.cibasc.com/image.asp?id=4040.

Colburn et al., "Step and Flash Imprint Lithography for sub-100 nm Patterning.", Proceedings of SPIE, Jan. 1, 2000, vol. 3997, pp. 453-457.

Colburn et al., "Step and Flash Imprint Lithography: A New Approach to High-Resolution Patterning.", Proc of SPIE, vol. 3676.

Cowie, "Polymers: Chemistry and Physics of Modern Materials.", 2nd Ed., Jan. 1, 1991, pp. 408-409.

Eldada et al., "Advanced Polymer Systems for Optoelectronic Integrated Circuit Applications.", SPIE, Jan. 1, 1997, vol. 3006, pp. 344-361.

Eldada et al., "Affordable WDM Components: The Polymer Solution.", SPIE, Jan. 1, 19998, vol. 3234, pp. 161-174.

Eldada et al., "Robust Photopolymers for MCM, Board, and Backplane Optical Interconnects.", SPIE, Jan. 1, 1998, vol. 3288, pp. 175-191.

Feldman et al., "Wafer Chuck Magnification Correction in X-Ray Lithography.", J. Vac. Sci. Technol. B 16(6), Nov. 1, 1998, pp. 3476-3479.

Feynman, "There's Plenty of Room at the Bottom.", International Appl. No. PCT/US2002/015551.

Gokan et al., "Dry Etch Resistance of Organic Materials.", J. Electrochem. Soc.: Solid-State Science and Technology, Jan. 1, 1983, pp. 143-146.

Goldfarb et al., "A Well-Behaved Revolute Flexure Joint for Compliant Mechanism Design.", ASME Journal of Mechanical Design, Sep. 1, 1999, vol. 121, No. 3, pp. 424-429.

Howell et al., "A Loop-Closure Theory for the Analysis and Synthesis of Compliant Mechanisms.", Journal of Mechanical Design, Mar. 1, 1996, vol. 188, pp. 121-125.

Hu et al., "Fluorescence Probe Techniques (FPT) for Measuring the Relative Efficiencies of Free-Radical Photoinitiators.", Macromolecules, May 29, 1998, 31, pp. 4107-4113.

International Application No. PCT/US2002/015551, Communication Relating to the Results of the Partial International Search.

International Search Report for PCT/US 00/30041, Oct. 18, 2001.

International Search Report for PCT/US 01/26049, Feb. 19, 2002.

Johnson et al., "Advances in Step and Flash Imprint Lithography.", SPIE Microlithography Conference, Feb. 23, 2003.

Kanetomo et al., "Robot for Use in Ultrahigh Vacuum.", Solid State Technology, Aug. 1, 1997, pp. 63-72.

Kawata et al., "Imprint/Photo Hybrid Lithography Using Conventional Contact Aligner.", Japanese Journal of Applied Physics, Jun. 29, 2004, vol. 43, No. 68, pp. 4027-4030.

Kim et al., "High-precision Magnetic Levitation Stage for Photolithography.", Precision Engineering, Apr. 1, 1998, vol. 22, No. 2, pp. 66-77.

Kim et al., "Reducing Photocurable Polymer Pattern Shrinkage and Roughness during Dry Etching in Photo-Nanoimprint Lithography.", Japanese Journal of Applied Physics, Jun. 29, 2004, vol. 43, No. 6B, pp. 4022-4026.

Kim et al., "Surface Energy and Polarity of Treated Indium-Tin-Oxide Anodes for Polymer Light-Emitting Diodes Studied by Contact Angle Measurements.", Journal of Applied Physics, 1999, pp. 2774-2778, vol. 86, No. 5.

Martin et al., "Predication of Fabrication Distortions in Step and Flash Imprint Lithography Templates.", Journal of Vacuum Science. B 20(6) pp. 2891-2895, Nov. 1, 2002.

Merlet, "Parallel Manipulators: State of the Art and Perspectives.", Advanced Robotics, Jan. 1, 1994, vol. 8, pp. 589-596.

Mirkin et al., "Emerging Methods for Micro-and-Nanofabrication.", MRS Bulletin, Jul. 1, 2001, pp. 506-509.

Mitsui et al., "Application of Two-Wavelength Optical Heterodyne Alignment System in XS-1.", Part of the SPIE Conference on Emerging Lithographic Technologies III, Mar. 1, 1999, SPIE vol. 3676, pp. 455-464.

Mittal, "Precision Motion Control of a Magnetic Suspension Actuator Using a Robust Nonlinear Compensation Scheme", IEE/ASME Transactions on Mechatronics., Dec. 1, 1997, vol. 2., No. 4, pp. 268-280.

Moon et al., Interferometric-Spatial-Phase Imaging for Six-Axis Mask Control, Oct. 17, 2003, MIT Nanostructures Laboratory, Research Laboratory of Electronics.

Nakamatsu et al., "Bilayer Resist Method for Room-Temperature Nanoimprint Lithography.", Japanese Journal of Applied Physics, Jun. 29, 2004, vol. 43, No. 6B, pp. 4050-4053.

NERAC.COM Retro Search, "Imprint Lithography." Oct. 16, 2004.

NERAC.COM Retro Search, "Multi-Layer Resists", Sep. 2, 2004.

NERAC.COM Retro Search, "Reduction of Dimension of Contact Holes", Aug. 31, 2004.

NERAC.COM Retro Search, "Trim Etching of Features Formed on an Organic Layer", Sep. 2, 2004.

Nguyen, "Asymmetric Fluid-Structure Dynamics in Nanoscale Imprint Lithography." The University of Texas at Austin, Aug. 1, 2001, pp. 1-111.

Office Action from U.S. Pub. 2003-0133126-A1.

Ohya et al., "Development of 3-DOF Finger Module for Micro Manipulation", Proc. of IEEE, Mar. 1, 1999, Intl. Conf. on Intelligent Robots and Systems, pp. 894-899.

Otto et al., "Characterization and Application of a UV-based Imprint Technique", Microelectronic Engineering 57-58, Jan. 1, 2001, pp. 361-366.

Otto et al., "Reproducibility and Homogeneity in Step and Repeat UV-Nanoimprint Lithography", Microelectronic Engineering 73-74, Jan. 1, 2004, pp. 152-156.

Otto et al., "Step and Repeat UV-Nanoimprint Lithography: Material Issues", NNT02 San Francisco, Dec. 11, 2002.

Papirer et al., "Abstract of The Grafting of Perfluorinated Silanes onto the Surface of Silica: Characterization by Inverse Gas Chromatography", Journal of Colloid and Interface Science 159, Aug. 1, 1993, pp. 238-242.

Papirer et al., "The Grafting of Perflourinated Silanes onto the Surface of Silica: Characterization by Inverse Gas Chromatography", Journal of Colloid and Interface Science 159, Aug. 1, 2003, pp. 238-242.

Parikh et al., "An Intrinsic Relationship between Molecular Structure in Self-Assembled n-Alkylsiloxane Monolayers and Deposition Temperature.", Journal of Phys. Chem., Jul. 1, 1994, pp. 7577-7590.

Paros et al., "How to design Flexure Hinges.", Machine Design, Nov. 25, 1965, pp. 151-156.

Peng et al., "Compliant Motion Control of Kinematically Redundant Manipulators.", IEEE Transactions on Robotics and Automation, Dec. 1, 1993, vol. 9, No. 6, pp. 831-837.

Sagiv, "Organized Monolayers by Absorption. 1, Formation and Structure of Oleophobic Mixed Monolayers on Solid Surfaces.", Journal of American Chemical Society/102:1, Jan. 2, 1980.

Scheer et al., "Problems of the Nanoimprinting Technique for Nanometer Scale Pattern Definition.", J. Vac. Sci. Techno. B., Nov. 1, 1998, pp. 3917-3921.

Schneider et al., "The Wave-Printer: Towards Large-Area, Multilayer Microcontact Printing.", Proc. of 4th Euspen International Conference, Glasgos, Scotland (UK), May 1, 2004.

Slocum, "Precision Machine Design: Macromachine Design Philosophy and Its Applicability to the Design of Micromachines.", Micro Electro Mechanical Systems, Feb. 4, 1992.

Sowah, "Diamond Used to Break the Mould [online].", [Retrieved on Sep. 2, 2003.] Retried from the Internet: <URL: http: HTTP://eetuk.com/showArticle,jhtml?articleID=19203691>., Sep. 2, 2003.

Sreenivasan et al., "IDF Spin Cast Imprinting.", Oct. 21, 2004, Powerpoint Presentation.

Srinivasan et al., "Alkyltrichlorosilane-Based Self-Assembled Monolayer Films for Stiction Reduction in Silicon Micromachines.", Journal of Microelectromechanical Systems, Jun. 1, 1998, vol. 7, No. 2, p. 252-260.

Stewart, "A Platform With Six Degrees of Freedom.", Proc Instn Mech Engrs, May 28, 1965, vol. 180, Pt1, No. 15, pp. 371-378.

Stix, "Getting More from Moores", Scientific American.

Sung et al., "Abstract of Micro/nano-tribological Characteristics of Self-Assembled Monolayer and its Application in Nano-Structure Fabrication", Elsevier Science B.V., Jul. 1, 2003, vol. 255, No. 7.

Sung et al., "Micro/nano-tribological Characteristics of Self-Assembled Monolayer and its Application in Nano-Structure Fabrication.", Elsevier Science B.V., Jul. 1, 2003, vol. 255, No. 7, pp. 808-818.

Tajbakhsh et al., "Three-Degree-of-Freedom Optic Mount for Extreme Ultraviolet.", American Society for Precision Engineering, Jan. 1, 1998, pp. 359-362.

Tanikawa et al., "Development of Small-sized 3 DOF Finger Module in Micro Hand for Micro Manipulation.", Proc. of IEEE, Mar. 1, 1999, Intl. conf. on Intelligent Robots and Systems, pp. 876-881.

Tomita et al., "A 6-axes Motion Control Method for Parallel-Linkage-Type Fine Motion Stage.", JSPE-58-04, pp. 118-124.

Translation of Japanese Patent 02-24848, Jan. 26, 1990.

Translation of Japanese Patent 02-92603, Apr. 3, 1990.

Trilogy Systems, "Linear Motors 310", www.trilogysystems.com, Jan. 1, 2001.

Uchida et al., "A Mask-to-Wafer Alignment and Gap Setting Method for X-ray Lithography Using Graftings", Journal Vacuum Science Technology, Nov. 1, 1991, B 9 (6), pp. 3202-3206.

U.S. Appl. No. 09/698,317, filed Oct. 27, 2000, Choi et al., "High Precision Orientation Alignment and Gap Control Stages for Imprint Lithography Processes."

U.S. Appl. No. 10/463,396, filed Jun. 17, 2003, Choi et al., "Method to Reduce Adhesion Between a Conformable Region and a Pattern of a Mold."

U.S. Appl. No. 10/614,716, filed Jul. 7, 2003, Sreenivasan et al., "A Conforming Template for Patterning Liquids Disposed on Substrates."

U.S. Appl. No. 10/666,527, filed Sep. 18, 2003, Bailey et al., "Imprint Lithography Templates having Alignment Marks."

U.S. Appl. No. 10/677,639, filed Oct. 2, 2003, McMackin et al., "Single Phase Fluid Imprint Lithography Method."

U.S. Appl. No. 10/687,519, filed Oct. 16, 2003, Truskett et al., "Low Surface Energy Templates."

U.S. Appl. No. 10/687,562, filed Oct. 16, 2003, Cherala et al., "Applying Imprinting Material to Substrates Employing Electromagnetic Fields."

U.S. Appl. No. 10/694,284, filed Oct. 27, 2003, Xu, "Methods for Fabricating Patterned Features Utilizing Imprint Lithography."

U.S. Appl. No. 10/760,821, filed Jan. 20, 2004, Sreenivasan et al., "Method for Concurrently Employing Differing Materials to Form a Substrate."

U.S. Appl. No. 10/784,911, filed Feb. 23, 2004, Xu, "Materials for Imprint Lithography."

U.S. Appl. No. 10/785,248, filed Feb. 24, 2004, Choi et al., "A Method to Control the Relative Position Between a Body and a Surface."

U.S. Appl. No. 10/788,700, filed Feb. 27, 2004, Sreenivasan et al., "Full-Wafer or Large Area Imprinting with Multiple Separated Sub-Fields for High Throughput Lithography."

U.S. Appl. No. 10/864,214, filed Jun. 9, 2004, Sreenivasan et al., "An Imprint Lithography System to Produce a Light to Impinge upon and Polymerize a Liquid in Superimposition with Template Overlay Marks."

U.S. Appl. No. 10/898,034, filed Jul. 23, 2004, McMackin et al., "A Method of Creating a Turbulent Flow of Fluid between a Mold and a Substrate."

U.S. Appl. No. 10/898,037, filed Jul. 23, 2004, McMackin et al., "A System of Creating a Turbulent Flow of Fluid between a Mold and a Substrate."

U.S. Appl. No. 60/394,458, filed Jul. 8, 2002, Sreenivasan et al., "Method and Apparatus for Whole Wafer Planarization using Optical Flats and Light Curable Liquids."

U.S. Appl. No. 10/616,294, filed Jul. 9, 2003, Choi et al., "Systems for Magnification and Distortion Correction for Imprint Lithography Processes."

Vanderbilt, "VU9730 Specifications for Improved Flexure Device", Vanderbilt University Office of Transfer Technology, 101, 25, 192-199.

Wang et al., "Passive Compliance versus Active Compliance in Robot-Based Automated Assembly Systems", Industrial Robot, Jan. 1, 1998, vol. 25, No. 1, pp. 48-57.

White et al., "Novel Alignment System for Imprint Lithography", J. Vac. Sci. Technol. B 18(6), Nov. 1, 2000, pp. 3552-3556.

Williams et al., "Six Degree of Freedom Mag-Lev Stage Development", SPIE, Jan. 1, 1997, vol. 3051, pp. 856-867.

Wu, "Large Area High Density Quantized Magnetic Disks Fabricated Using Nanoimprint Lithography", J. Vac. Sci. Technol., Nov. 1, 1998, B 16(6), pp. 3825-3829.

Xia et al., "Soft Lithography", Angew. Chem. Int. Ed., Jan. 1, 1998, pp. 551-575.

Xia et al., "Soft Lithography", Annu Rev. Mater. Sci., 1998, 28: 153-184.

Data sheet for Silsesquioxanes, Aldrich website-printed Sep. 20, 2005.

Dent et al., "Microelectronic Grade Silicone Materials for CSP, " 1999.

Barclay et al., "Bilayer Resist Solutions for Sub 100nm Device Production". publication date that is known to applicant is before the filing date of the instant application.

Pernette et al., "Design of Parallel Robots in Microbotics", Robotica, Jan. 1, 1997, vol. 15, pp. 417-420.

Physik Instruments, "Hexapod Six-Axts Parallel Kinematics Robot", Nano Positioning, Jan. 1, 1998, pp. 8.4-8.5.

Physik Instruments, "NanoPositioning, MicroPositioning, Piezo Technology", PI Online Catalog, Jan. 1, 1999, www.physikinstruments.com.

Physik Instruments, "Product Catalog for Micropositioning", 1997.

"Photoresist Coating Methods", E-Mail from Susan Bagen (BAGEN@aol.com) to Dhaval Shah, Sep. 18, 1997.

Raibert et al., "Hybrid Position/Force Control of Manipulators", Journal of Dynamic Systems, Measurement, and Control, Jun. 1, 1981, vol. 102, pp. 126-133.

Rong et al., "Design and Analysis of Flexure-Hige Mechanism Used in Micro-Positioning Stages", ASME, Jan. 1, 1994, vol. 2, pp. 979-985.

Rong et al., "Dynamics of Parallel Mechanism with Direct Compliance Control", IEEE, Jan. 1, 1997, pp. 1753-1758.

Roos et al., "Abstract of Nanoimprint Lithography with a Commercial 4 inch Bond System for Hot Embossing", Proceedings of SPIE, Oct. 1, 2001, vol. 4343, pp. 427-435.

Roos et al., "Nanoimprint Lithography with a Commercial 4 inch Bond System for Hot Embossing", Proceedings of SPIE, Oct. 1, 2001, vol. 4343, pp. 427-435.

Ruchhoeft et al., "Patterning Curved Surfaces: Template Generation by Ion Beam Proximity Lithography and Relief Transfer by Step and Flash Imprint Lithography", Journal of Vacuum Science and Technology, pp.1-17.

Koseki, "Design and Accuracy Evaluation of High-Speed and High Precision Parallel Mechanism.", Proc. Of IEEE, Jan. 1, 1998, Intl. Conf. on Robotics & Automation, pp. 1340-1345.

Kotachi et al., "Si-Containing Positive Resist for Arf Excimer Laser Lithography.", Photopolymer Science and Technology, Nov. 4, 1995, pp. 615-622.

Krauss et al., "Fabrication of Nanodevices Using Sub-25 nm Imprint Lithography.", Appl. Phy. Lett., Jan. 1, 1995, 67 (21), pp. 3114-3116.

Krug et al., "Fine Patterning of Thin Sol-gel Films.", Journal of Non-Crystalline Solids, Jan. 1, 1992, 147 & 148, pp. 447-450.

Kumar et al., "Features of Gold Having Micrometer to Centimeter Dimensions can be Formed Through a Combination of Stamping with an Elastomeric Stamp and an Alkanethiol "ink" followed by Chemical Etching.", Applied Physics Letters, Oct. 4, 1993, vol. 63, Issue 14, pp. 2002-2004.

Lee et al., "An Ultraprecision Stage for Alignment of Wafers in Advanced Microlithography.", Precision Engineering, Sep. 1, 1997, pp. 113-122.

Lee et al., "Ultra Precision Positioning System for Servo Motor-piezo Actuator Using the Dual Servo Loop and Digital filter Implementation.", American Society for Precision Engineering, Jan. 1, 1998, pp. 287-290.

Lin, "Multi-Layer Resist Systems.", Introduction to Microlithography, Feb. 14, 1983, pp. 287-349.

Lucas Aerospace, Free-Flex® Pivot Catalog, Jan. 1, 1999.

Luurtsema, "Spin Coating for Rectangular Substrates.", Retrieved May 23, 2002 from URL: http://buffy.eecs.berkelye.edu/IRO/Summary/97abstracts/gluurts.2.html, May 23, 1992.

Mansky et al., "Large-Area Domain Alignment in Block Copolymer Thin Films Using Electric Fields.", Macromolecules, Jun. 9, 1998, vol. 31, No. 13, pp. 4399-4401.

Goldfarb et al., "Compliant Micromanipulator Design for Scaled Bilateral Telemanipulation of Small-Scale Environments.", ASME International Mechanical Engineering Conference and Exposition, Nov. 1, 1998, DSC- vol. 64, pp. 213-218.

Haisma et al., "Mold-assisted Nanolithography: A Process for Reliable Pattern Replication.", J. Vac. Sci. Technol. B, Nov. 1, 1996, pp. 4124-4128.

Hashimoto et al., "Design and Characteristics of a Parallel Link Compliant Wrist." IEEE, May 1, 1994, Department of Mechanical Engineering, Kagoshiam University, pp. 2457-2462.

Heidari, "Nanoimprint Lithography at the 6 in. Wafer Scale.", J. Vac. Sci. Technol. B 18 (6), Nov. 1, 2000, pp. 3557-3560.

HEXAPODS, "G1000-PS Power SerIes", www.hexapods.com.

Hexel Coporation, "Tornado 2000 System Specifications.", www.hexel.com, Nov. 12, 1999.

Hirai et al., "Abstract of Mold Surface Treatment for Imprint Lithography", Journal of Photopolymer Science and Technology, Aug. 28, 2001, pp. 457-462, vol. 14, No. 3.

Hirai et al., "Mold Surface Treatment for Imprint Lithography.", Journal of Photopolymer Science and Technology, Aug. 1, 2001, vol. 14, No. 3, pp. 457-462.

Hiroshima et al., "Step-and-Repeat Photo-Nanoimprint System Using Active Orientation Head.", Japanese Journal of Applied Physics, Jun. 29, 2004, vol. 43, No. 68, pp. 4012-4016.

Hogan et al., "Impedance Control: An Approach to Manipulation: Part 1- Theory.", Journal of Dynamic Systems, Measurement, and Control, Mar. 1, 1985, vol. 107, pp. 1-7.

Hollis et al., "A Six-Degree-of-Freedom Magnetically Levitated Variable Compliance Fine-Motion Wrist: Design, Modeling, and Contro.", IEEE Transactions on Robotics and Automation, Jun. 1, 1991, vol. 7., No. 3, pp. 320-332.

* cited by examiner

COMPOSITION FOR AN ETCHING MASK COMPRISING A SILICON-CONTAINING MATERIAL

BACKGROUND OF THE INVENTION

The field of invention relates generally to micro-fabrication of structures. More particularly, the present invention is directed to formation of an etching mask comprising a silicon containing material used in semiconductor processing.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. An imprint device makes mechanical contact with the polymerizable fluid. The imprint device includes a relief structure formed from lands and grooves. The polymerizable fluid composition fills the relief structure, with the thickness of the polymerizable fluid in superimposition with the lands defining a residual thickness. The polymerizable fluid composition is then subjected to conditions to solidify and polymerize the same, forming a solidified polymeric material on the transfer layer that contains a relief structure complimentary to that of the imprint device. The imprint device is then separated from the solid polymeric material such that a replica of the relief structure in the imprint device is formed in the solidified polymeric material. The transfer layer and the solidified polymeric material are subjected to an environment to selectively etch the transfer layer relative to the solidified polymeric material such that a relief image is formed in the transfer layer. Thereafter, conventional etching processes may be employed to transfer the pattern of the relief structure into the substrate.

In recent trends in micro-fabrication of semiconductors, a silicon containing material has been utilized as a masking layer for underlying layers during etching. An example of utilizing silicon as a masking layer is found in, U.S. Pat. No. 6,468,896 to Röhr et al., entitled "Method of Fabricating Semiconductor Components," discloses a method of depositing a silicon layer upon a metal layer, selectively etching the silicon layer with the selectively etched silicon layer serving as a hard mask when etching of the metal layer occurs.

In another example, U.S. patent application Ser. No. 10/178,947 to Watts et al., entitled "Low Viscosity High Resolution Patterning Material," discloses a method of forming a conformal layer upon a patterned layer with the conformal layer serving as a hard mask for the patterned layer during etching and the conformal layer being formed from a silicon-containing polymerized fluid.

It is desired, therefore, to provide an improved composition of the silicon-containing material used in imprint lithography processes.

SUMMARY OF THE INVENTION

The present invention includes a composition for a silicon-containing material used as an etch mask. More specifically, the silicon-containing material may be used as an etch mask for an imprinted layer comprising protrusions and recessions. To that end, in one embodiment of the present invention, the composition includes a silicone resin, a cross-linking agent, a catalyst, and a solvent. This composition allows the silicon-containing material to selectively etch the protrusions and the segments of the patterned imprinted layer in superimposition therewith, while minimizing the etching of the segments in superposition with the recessions, and therefore allowing an in-situ hardened mask to be created by the silicon-containing material, with the hardened mask and the imprinting layer forming a substantially planarized profile. In a further embodiment, the composition includes an epoxy-functional silane in addition to the aforementioned components. The epoxy-functional silane is added to improve the cross-linking conversion rate of the composition.

DETAILED DESCRIPTION OF THE INVENTION

Figure 1:
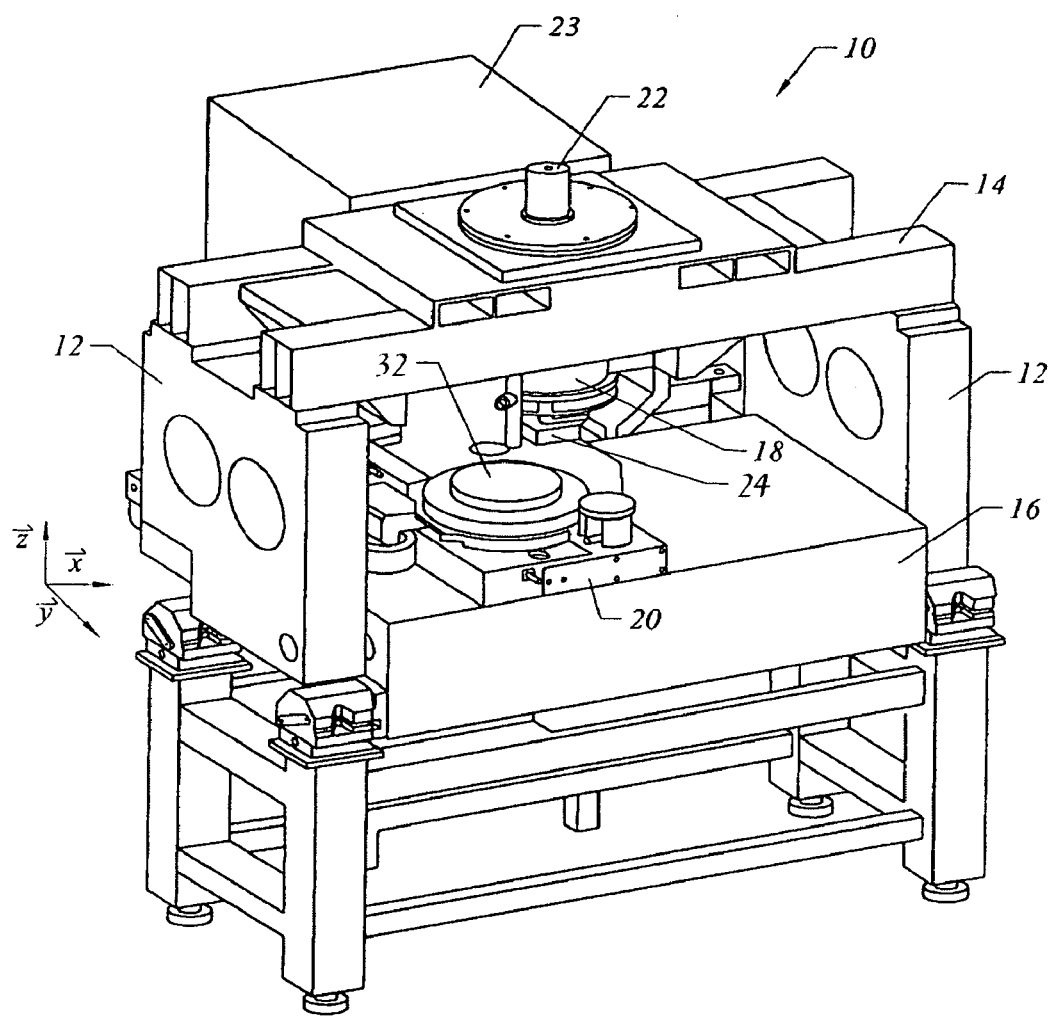
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes and may provide movement along the Z axis as well. A radiation source 22 is coupled to system 10 to impinge actinic radiation upon motion stage 20. As shown, radiation source 22 is coupled to bridge 14 and includes a power generator 23 connected to radiation source 22.

Figure 2:
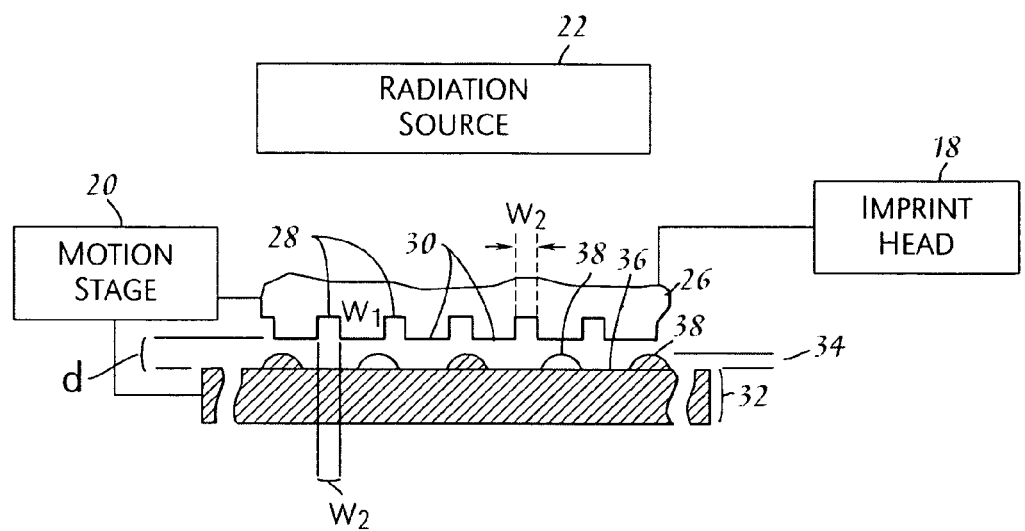
FIG. 2 is a simplified elevation view of a lithographic system, shown in FIG. 1, employed to create a patterned imprinting layer in accordance with the present invention.

Referring to both FIGS. 1 and 2, connected to imprint head 18 is a template 24 having a patterned mold 26 thereon. Patterned mold 26 includes a plurality of features defined by a plurality of spaced-apart recesses 28 and projections 30. Projections 30 have a width $W_1$, and recesses 28 have a width $W_2$, both of which are measured in a direction that extends transversely to the Z axis. The plurality of features defines an original pattern that forms the basis of a pattern to be transferred into a substrate 32 positioned on motion stage 20. To that end, imprint head 18 is adapted to move along the Z axis and vary a distance "d" between patterned mold 26 and substrate 32. Alternatively, or in conjunction with imprint head 18, motion stage 20 may move template 24 along the Z-axis. In this manner, the features on patterned mold 26 may be imprinted into a flowable region of substrate 32, discussed more fully below. Radiation source 22 is located so that patterned mold 26 is positioned between radiation source 22 and substrate 32. As a result, patterned mold 26 is fabricated from material that allows it to be substantially transparent to the radiation produced by radiation source 22. An exemplary system is available under the trade name IMPRIO 100™ from Molecular Imprints, Inc. having a place of business at 1807-C Braker Lane, Suite 100, Austin, Tex. 78758. The system description for the IMPRIO 100™ is available at www.molecularimprints.com and is incorporated herein by reference.

Figure 3:
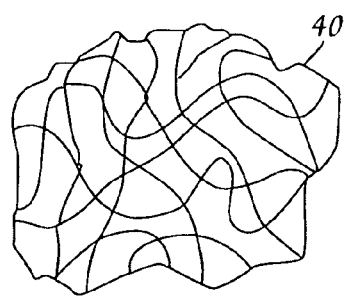
FIG. 3 is a simplified representation of material from which a patterned imprinting layer, shown in FIG. 2, is comprised before being polymerized and cross-linked in accordance with the present invention.

Referring to both FIGS. 2 and 3, a flowable region, such as an imprinting layer 34, is disposed on a portion of surface 36 that presents a substantially planar profile. In the present embodiment, the flowable region is deposited as a plurality of spaced-apart discrete droplets 38 of material 40 on substrate 32, discussed more fully below. Material 40 is substantially silicon-free and may be selectively polymerized and cross-linked to record an inverse of the original pattern therein, defining a recorded pattern. Material 40 is shown in FIG. 4 as being cross-linked at points 42, forming cross-linked polymer material 44.

Figure 5:
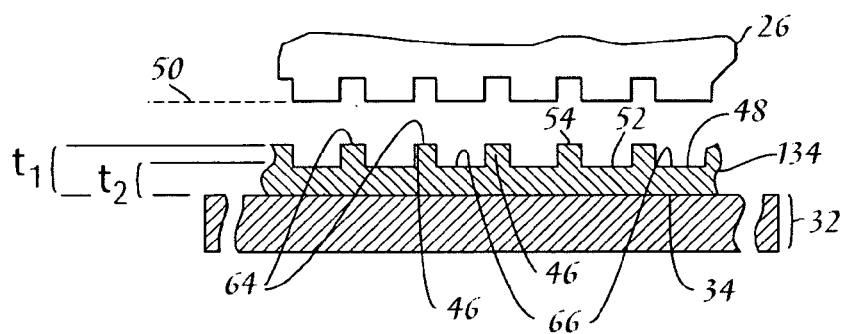
FIG. 5 is a simplified elevation view of an imprint device spaced-apart from the patterned imprinting layer, shown in FIG. 1, after patterning in accordance with the present invention.

Referring to FIGS. 2, 3 and 5, the pattern recorded in imprinting layer 34 is produced, in part, by mechanical contact with patterned mold 26. To that end, the distance "d" is reduced to allow imprinting layer 34 to come into mechanical contact with patterned mold 26, spreading droplets 38 so as to form imprinting layer 34 with a contiguous formation of material 40 over surface 36. In one embodiment, distance "d" is reduced to allow sub-portions 46 of imprinting layer 34 to ingress into and fill recesses 28.

In the present embodiment, sub-portions 48 of imprinting layer 34 in superimposition with projections 30 remain after the desired, usually minimum distance "d", has been reached, leaving sub-portions 46 with a thickness $t_1$, and sub-portions 48 with a thickness, $t_2$. Thickness $t_2$ is referred to as a residual thickness. Thicknesses "$t_1$" and "$t_2$" may be any thickness desired, dependent upon the application. The total volume contained in droplets 38 may be such so as to minimize, or avoid, a quantity of material 40 from extending beyond the region of surface 36 in superimposition with patterned mold 26, while obtaining desired thicknesses $t_1$ and $t_2$.

Figure 4:
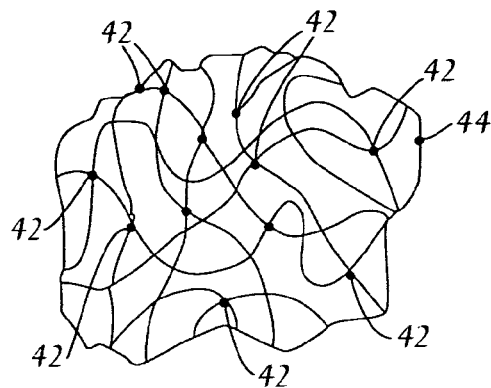
FIG. 4 is a simplified representation of cross-linked polymer material into which the material shown in FIG. 3 is transformed after being subjected to radiation in accordance with the present invention.

Referring to FIGS. 2, 3, and 4, after a desired distance "d" has been reached, radiation source 22 produces actinic radiation that polymerizes and cross-links material 40, forming cross-linked polymer material 44. As a result, the composition of imprinting layer 34 transforms from material 40 to material 44, which is a solid. Specifically, material 44 is solidified to form solidified imprinting layer 134 with a side having a shape that conforms to a shape of a surface 50 of patterned mold 26, shown more clearly in FIG. 5. As a result, solidified imprinting layer 134 is formed having recessions 52 and protrusions 54. After formation of solidified imprinting layer 134, distance "d" is increased so that patterned mold 26 and solidified imprinting layer 134 are spaced-apart. Typically, this process is repeat several times to pattern different regions (not shown) of substrate 32, referred to as a step and repeat process. An exemplary step and repeat process is disclosed in published United States patent application number 20040008334, which assigned to assignee of the present invention and is incorporated by reference.

Referring to FIGS. 1, 2 and 3, the characteristics of material 40 are important to efficiently pattern substrate 32 in light of the unique deposition process employed. As mentioned above, material 40 is deposited on substrate 32 as a plurality of discrete and spaced-apart droplets 38. The combined volume of droplets 38 is such that the material 40 is distributed appropriately over an area of surface 36 where imprinting layer 34 is to be formed. In this fashion, the total volume of imprinting material 40 in droplets 38 defines the distance "d", to be obtained so that the total volume occupied by the material 40 in the gap defined between patterned mold 26 and the portion of substrate 32 in superimposition therewith once the desired distance "d" is reached is substantially equal to the total volume of material 40 in droplets 38. As a result, imprinting layer 34 is spread and patterned concurrently, with the pattern being subsequently set by exposure to radiation, such as ultraviolet radiation. To facilitate the deposition process, it is desired that material 40 have certain characteristics to provide rapid and even spreading of material 40 in droplets 38 over surface 36 so that the all thicknesses $t_1$ are substantially uniform and all residual thicknesses $t_2$ are substantially uniform.

An exemplary composition for material 40 is silicon-free and consists of the following:

Composition 1 isobornyl acrylate n-hexyl acrylate ethylene glycol diacrylate 2-hydroxy-2-methyl-1-phenyl-propan-1-one In COMPOSITION 1, isobornyl acrylate comprises approximately 55% of the composition, n-hexyl acrylate comprises approximately 27%, ethylene glycol diacrylate comprises approximately 15% and the initiator 2-hydroxy-2-methyl-1-phenyl-propan-1-one comprises approximately 3%. The initiator is sold under the trade name DAROCURE® 1173 by CIBA® of Tarrytown, N.Y. The above-identified composition also includes stabilizers that are well known in the chemical art to increase the operational life of the composition. To provide suitable release properties, COMPOSITION 1 may be employed with a template treated to have a mold surface that is hydrophobic and/or low surface energy, e.g., an a priori release layer.

Referring to FIGS. 3 and 5, to improve the release properties of patterned mold 26 and solidified imprinting layer 134 and to ensure that solidified imprinting layer 134 does not adhere to patterned mold 26, an additive may be included in COMPOSITION 1. To that end, material 40 may include, as an additive, a surfactant. For purposes of this invention a surfactant is defined as any molecule, one tail of which is hydrophobic. Surfactants may be either fluorine containing, e.g., include a fluorine chain, or may not include any fluorine in the surfactant molecule structure. An exemplary surfactant is available under the trade name ZONYL® FSO-100 from DUPONT™ that has a general structure of $R_fR_2$ where $R_1=F(CF_2CF_2)_y$, with y being in a range of 1 to 7, inclusive and $R_2=CH_2CH_2O(CH_2CH_2O)_xH$, where X is in a range of 0 to 15, inclusive. This provides material 40 with the following composition:

Composition 2 isobornyl acrylate n-hexyl acrylate ethylene glycol diacrylate 2-hydroxy-2-methyl-1-phenyl-propan-1-one

The ZONYL® FSO-100 additive comprises less than 1% of the composition, with the relative amounts of the remaining components being as discussed above with respect to COMPOSITION 1. However, the percentage of ZONYL® FSO-100 may be greater than 1%.

Figure 6:
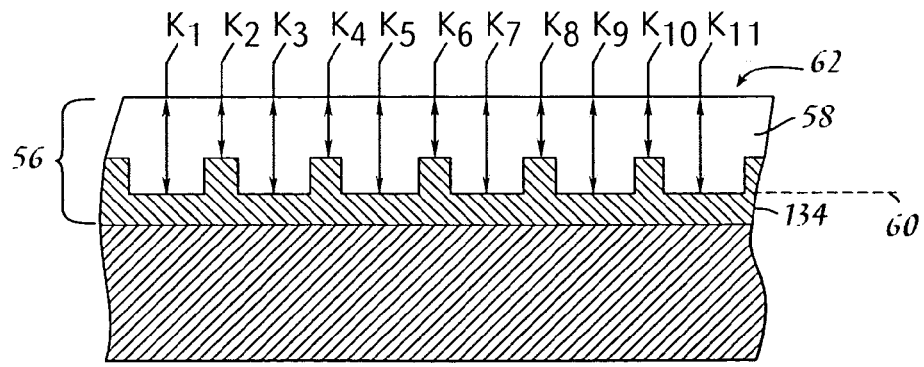
FIG. 6 is a simplified elevation view of formation of a multi-layered structure on a solidified imprinting layer, shown in FIG. 5, by deposition of a conformal layer, adjacent to the patterned imprinting layer, employing a mold in accordance with one embodiment of the present invention.

Referring to FIGS. 5 and 6, to facilitate transferring of the pattern in patterned mold 26 into substrate 32, a multi-layered structure 56 is generated by formation of a silicon-containing conformal layer 58 adjacent to solidified imprinting layer 134. To that end, silicon-containing material is deposited adjacent to solidified imprinting layer 134. Specifically, a silicon-containing material may be deposited adjacent to solidified imprinting layer 134 using any known technique to form conformal layer 58, such as the technique discussed above with respect to deposition of material 40. Alternatively, the silicon-containing material may be deposited adjacent to solidified imprinting layer 134 employing spin-coating techniques.

In an exemplary technique for forming conformal layer 58, silicon-containing material is deposited adjacent to solidified imprinting layer 134 using spin-coating techniques and subsequently thermally curing the silicon-containing material to form conformal layer 58. To that end, exemplary material that may be employed to form conformal layer 58 includes silicone resin, a cross-linking agent, a catalyst, and a solvent.

The silicone resin is process compatible, satisfying ionic, purity, and by-product contamination requirements desired. The cross-linking agent is included to cross-link the silicone resin, providing conformal layer 58 with the properties to record a pattern thereon having very small feature sizes, i.e., on the order of a few nanometers. To that end, the catalyst is provided to produce a condensation reaction in response to thermal energy, e.g., heat, causing the silicone resin and the cross-linking agent to polymerize and cross-link, forming a cross-linked polymer material. The solvent selected is compatible with the silicone resin and represents the remaining balance of the silicon-containing material. It is desired that the solvent minimize, if not avoid, causing distortions in solidified imprinting layer 134 due, for example, to swelling of solidified imprinting layer 134.

The silicone resin can be any alkyl and/or aryl substituted polysiloxane, copolymer, blend or mixture thereof. Examples of a silicone resin include ultraviolet (UV) curable sol-gels, UV curable epoxy silicone, UV curable acrylate silicone, and UV curable silicone via thiolene chemistry; and non-cured materials such as hydrogen silsesquioxane, and poly(meth)acrylate/siloxane copolymers. Silsesquixanes, or T-resins, having a general repeating unit with a formula: $RSiO_{1.5}$. Preferably, a hydroxyl-functional polysiloxane is used such as a hydroxyl-functional organo-siloxane, with examples of organo-siloxanes including methyl, phenyl, propyl and their mixtures. The silicone resin may be present in the silicon-containing composition in amounts of approximately 2 to 40% by weight, depending on the thicknesses desired for conformal layer 58. An example of a hydroxyl-functional polysiloxane used in the present invention is a silicon T-resin intermediate available from Dow Corning® (Midland, Mich.) under the trade name Z-6018.

The cross-linking agent is a compound that includes two or more polymerizable groups. The cross-linking agent may be present in the silicon-containing composition in amounts of approximately 2 to 50% by weight in relation to the quantity of silicone resin present. Typically, the cross-linking agent is present in the silicon-containing composition in an amount of approximately 20 to 30%. An example of a cross-linking agent used in the present invention is a hexamethoxymethylmelamine (HMMM) based aminoplast cross-linking agent available from Cytec Industries, Inc. (West Paterson, N.J.) under the trade name CYMEL 303ULF.

The catalyst may be any component that catalyzes a condensation reaction. Suitable catalysts may include, but are not limited to, acidic compounds such as sulfonic acid. The catalyst may be present in the silicon-containing material in amounts of approximately 0.05% to 5% by weight in relation to the silicone resin present. Typically, the catalyst is present in the silicon-containing material in an amount of approximately 1 to 2%. An example of a catalyst used in the present invention is toluenesulfonic acid available from Cytec Industries, Inc. (West Paterson, N.J.) under the trade name CYCAT 4040.

For the balance of the composition, a solvent is utilized. The solvent can be any solvent or combination of solvents that satisfies several criteria. As mentioned above, the solvent should not cause solidified imprinting layer 134 to swell. In addition, the evaporation rate of the solvent should be established so that a desired quantity of the solvent evaporates as a result of the spin-coating process while providing sufficient viscosity to facilitate planarization of silicon-containing material in furtherance of forming conformal layer 58. Suitable solvents may include, but are not limited to, alcohol, ether, a glycol or glycol ether, a ketone, an ester, an acetate and mixtures thereof. The solvent may be present in the silicon-containing material used to form conformal layer 58 in amounts of approximately 60 to 98% by weight, dependent upon the desired thicknesses of conformal layer 58. An example of a solvent used in the present invention is methyl amyl ketone available from Aldrich Co. (St. Louis, Miss.) under the trade name MAK.

In a further embodiment, the composition of conformal layer 58 is altered to include an epoxy-functional silane coupling agent to improve the cross-linking reaction and improve the rate of cross-linking. Examples of epoxy-functional silanes may include glycidoxymethyltrimethoxysilane, 3-glycidoxypropyltrihydroxysilane, 3-glycidoxypropyldimethylhydroxysilane, 3-glycidoxypropyltrimethoxysilane, 2,3-epoxypropyltrimethoxysilane, and the like. The epoxy-functional silane may be present in conformal layer 58 in amounts of approximately 2 to 30% by weight of silicon-containing compound in relation to the silicone resin and typically in an amount of 5 to 10%. An example of epoxy-functional silane used in the present invention is gamma-glycidoxypropyltrimethoxysilane available from GE Silicone/OSi Specialty (Wilton, Conn.) under the trade name A187.

Exemplary compositions from which to form conformal layer 58 are as follows:

Composition 3 hydroxyl-functional polysiloxane hexamethoxymethylmelamine toluenesulfonic acid methyl amyl ketone Composition 4 hydroxyl-functional polysiloxane hexamethoxymethylmelamine gamma-glycidoxypropyltrimethoxysilane toluenesulfonic acid methyl amyl ketone In COMPOSITION 3, hydroxyl-functional polysiloxane comprises approximately 4% of the composition, hexamethoxymethylmelamine comprisies approximately 0.95%, toluenesulfonic acid comprises approximately 0.05% and methyl amyl ketone comprises approximately 95%. In COMPOSITION 4, hydroxyl-functional polysiloxane comprises approximately 4% of the composition, hexamethoxymethylmelamine comprisies approximately 0.7%, gamma-glycidoxypropyltrimethoxysilane comprisies approximately 0.25%, toluenesulfonic acid comprises approximately 0.05%, and methyl amyl ketone comprises approximately 95%.

Both COMPOSITIONS 3 and 4 are made up of at least 4% of the silicone resin. Upon curing, however, the quantity of silicon present in conformal layer 58 is at least 5% by weight and typically in a range of 20% or greater. Specifically, the quantity and composition of the solvent present in COMPOSITIONS 3 and 4 is selected so that a substantial portion of the solvent evaporates during spin-coating application of the COMPOSITION 3 or 4 on solidified imprinting layer 134. In the present exemplary silicon-containing material, approximately 90% of the solvent evaporates during spin-coating. Upon exposing the silicon-containing material to thermal energy, the remaining 10% of the solvent evaporates, leaving conformal layer 58 with approximately 20% silicon by weight.

An exemplary method of forming conformal layer 58 includes spinning-on approximately 4 mL of the silicon-containing material deposited proximate to a center of solidified imprinting layer 134. To that end, substrate 32 is spun at 1000 rev/min for 1 min by placing substrate 32 on a hot plate. Thereafter, the silicon-containing material is subjected to thermal energy by baking at 150° C. for 1 min. This produces the silicon-containing material from which conformal layer 58 is formed, with thickness variations of 20 nm or less. Were it desired to increase the thickness of the solidified silicon-containing layer, e.g., to provide the solidified silicon-containing layer with a thickness of 200 nm, the aforementioned spin-coating and curing processes are simply repeated. As a result, the solvent employed is selected so as not to remove, "wash away," silicon-containing material in a well-cured conformal layer 58.

Referring to FIGS. 5 and 6, the spin-coating and curing processes, conformal layer 58 includes first and second opposed sides. First side 60 faces imprinting layer 134 and has a profile complementary to the profile of the imprinting layer 134. The second side faces away from imprinting layer 134 forming a normalization surface 62, which is substantially smooth and typically planar. In this manner, normalization surface 62 provides a solidified conformal layer 58 with a substantially normalized profile. It is believed that normalization surface 62 is provided with a smooth, e.g., substantially planar, topography by ensuring that COMPOSITIONS 3 and 4 have a glass transition temperature lower than the curing temperature. Specifically, it is desired that the temperature difference between the glass transition temperature and the curing temperature be sufficient to allow the silicon-containing material to reflow during curing to maximize smoothness, e.g., planarity of normalization surface 62 in a minimum amount of time. For example, the COMPOSITIONS 3 and 4 each have a glass transition temperature of approximately 50° C. and a curing temperature of 150° C. As a result, of the topography of normalization surface 62, the distances, $k_2$, $k_4$, $k_6$, $k_8$ and $k_{10}$, between the apex 64 of each of the protrusions 54 and normalization surface 62 are substantially the same. Similarly, the distance, $k_1$, $k_3$, $k_5$, $k_7$, $k_9$ and $k_{11}$ between a nadir surface 66 of each of the recessions 52 and normalization surface 62 are substantially the same.

Figure 7:
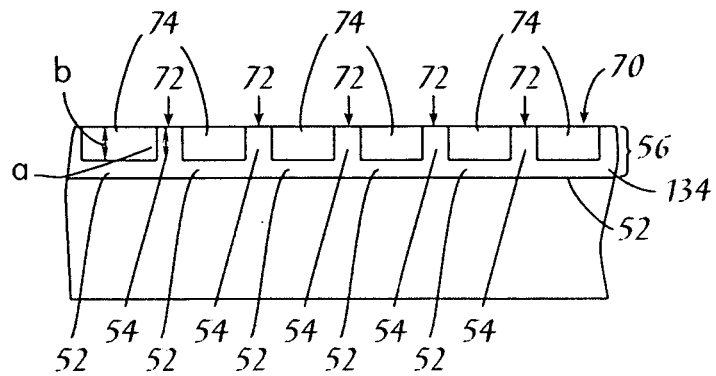
FIG. 7 is a simplified elevation view after a blanket etch of the multi-layered structure, shown in FIG. 6, to format a crown surface in the conformal layer with portions of the patterned imprinting layer being exposed in accordance with one embodiment of the present invention.

Referring to FIGS. 6 and 7, after formation of the normalization surface 62, a blanket etch is employed to remove portions of conformal layer 58 to provide multi-layered structure 56 with a crown surface 70. For example and without limitation, the blanket etch may be achieved in a system available from LAM Research 9400SE obtained from Lam Research, Inc. of Fremont, Calif. In this manner, normalization surface 62 is subjected to an isotropic halogen reactive ion etch ("RIE") rich in fluorine, i.e., wherein at least one of the precursors was a fluorine-containing material, for example, and without limitation, a combination of $CHF_3$ and $O_2$. Other suitable halogen compounds include, for example, and without limitation, $CF_4$. It is desirable that oxygen be absent from the plasma chemistry. Normalization surface 62 is subjected to the blanket etch sufficient to expose crown surface 70.

Crown surface 70 is defined by an exposed surface 72 of each of protrusions 54 and upper surfaces of portions 74 that remain on conformal layer 58 after the blanket etch. The composition of conformal layer 58 is such that when the blanket etch is applied to conformal layer 58, crown surface 70 is provided with a substantially planar profile. That is, the thickness of protrusions 54, shown as "a", is substantially the same as the thickness of portions 74, shown as "b". An exemplary blanket etch may be a plasma etch process employing a fluorine-based chemistry.

Figure 8:
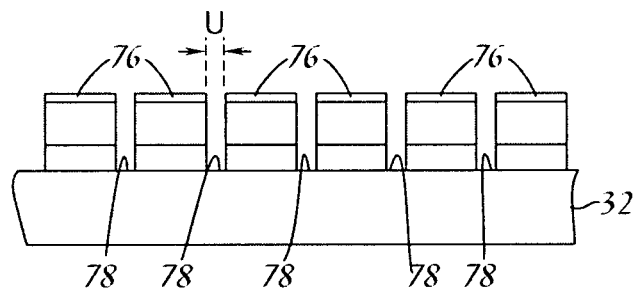
FIG. 8 is a simplified elevation view of the multi-layered structure, shown in FIG. 7, after subjecting the crown surface to an anisotropic etch to expose regions of a substrate in accordance with the present invention.

Referring to FIGS. 7 and 8, crown surface 70 is subjected to an anisotropic etch. The etch chemistry of the anisotropic etch is selected to maximize etching of protrusions 54 and the segments of imprinting layer 134, in superimposition therewith, while minimizing etching of the portions 74 in superimposition with recessions 52. In the present example, advantage was taken of the distinction of the silicon content between the imprinting layer 134 and the conformal layer 58. Specifically, employing an anisotropic plasma etch, e.g., an RIE plasma etch with an oxygen-based chemistry would create an in-situ hardened mask 76 in the regions of portions 74 proximate to crown surface 70. This results from the interaction of the silicon-containing polymerizable material with the oxygen plasma. As a result of the hardened mask 76 and the anisotropicity of the etch process, regions 78 of substrate 32 in superimposition with protrusions 54 are exposed. The width U' of regions 78 are optimally equal to width $W_2$, shown in FIG. 2.

Referring to FIGS. 2, 7 and 8, the advantages of this patterning process are manifold. For example, the relative etch rate differential between portions 74 and exposed surfaces 72 facilitates providing precise etch selectivity. As a result, the dimensional width U' of regions 78 may be precisely controlled, thereby reducing transfer distortions of the pattern into substrate 32. The resulting structure may be used as a mask to facilitate transfer of a pattern into substrate 32. Specifically, the etch differential provided by hardened mask 76 and the portions of solidified imprinting layer 134 in superimposition therewith would provide an etch differential in the presence of a blanket etch. In this manner, regions 78 of substrate 32 would etch sooner than regions of substrate 32 in superimposition with hardened mask 76. By properly selecting materials and etch chemistries, the relational dimensions between the differing features of the pattern eventually transferred into substrate 32 may be controlled as desired. For example, it was found beneficial to include an oxygen plasma etch after the fluorine etch and before the oxygen etch. Specifically, the etch selectivity during the oxygen plasma etch was improved. It is believed that residual fluorine is present on normalization surface 62 and that the Argon etch removes the residual fluorine, thereby further reducing the fluorine available during the oxygen plasma etch.

Figure 9:
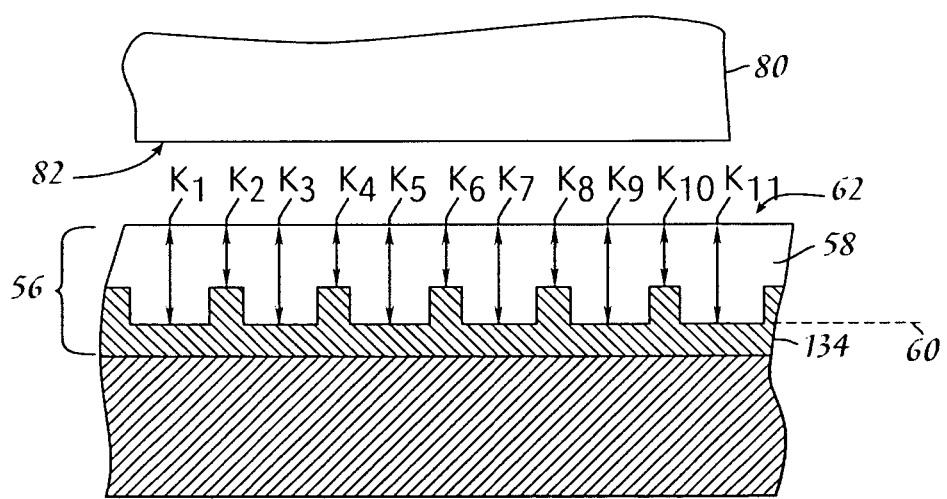
FIG. 9 is a simplified elevation view showing planarization of a conformal layer employing a planarized mold in accordance with an alternate embodiment of the present invention.

It has been found that additional planarization may be desired when forming conformal layer 58, shown in FIG. 6, when features of sub ten micron dimension are to be transferred into substrate 32. To that end, as shown in FIGS. 2 and 9, the silicon-containing material may be spun-on as discussed above with respect to forming conformal layer 58 or may be deposited as a plurality of droplets discussed above with respect to imprinting layer 34. After deposition of the silicon-containing material, a planarizing mold 80 having a substantially smooth, if not planar, surface 82 is employed to contact normalization surface 62, before solidification of the silicon-containing material in conformal layer 58. In this manner, conformal layer 58 is provided with a normalized surface with respect to solidified imprinting layer 134. This is typically achieved by providing an optical flat which has sufficient area to concurrently planarize all regions of substrate 32 that includes silicon-containing material employed to form normalization layer 58. Thereafter, the silicon-containing material in conformal layer 58 is solidified and planarized mold 80 is separated from conformal layer 58; and the normalization surface 62 may be processed as discussed above to pattern the same and transfer a pattern into substrate 32.

Figure 10:
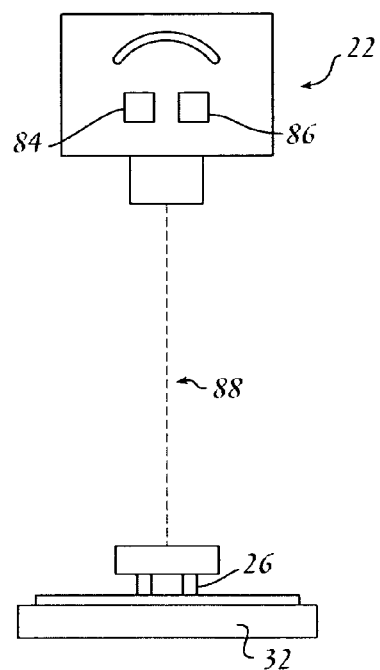
FIG. 10 is a simplified plan view of a radiation source employed in the lithographic system shown in FIG. 1, depicting dual radiation sources.

Referring to both FIGS. 2, 6 and 10, it may be desired to implement a step and repeat planarization process when forming normalization layer 58. To that end, radiation source 22 may be selected to provide actinic radiation to both effectuate cross-linking using both infrared (IR) radiation and ultraviolet radiation. An exemplary radiation source 22 may include multiple sources each of which produces a single range of wavelengths of radiation and is shown including two radiation sources 84 and 86. Radiation source 84 may be any known in the art capable of producing IR radiation, and radiation source 86 may be any known in the art capable of producing actinic radiation employed to polymerize and cross-link material in droplets 38, such as UV radiation. Specifically, radiation produced by either of sources 84 and 86 propagates along optical path 88 toward substrate 32. A circuit (not shown) is in electrical communication with radiation sources 84 and 86 to selectively allow radiation in the UV and IR spectra to impinge upon substrate 32.

Figure 11:
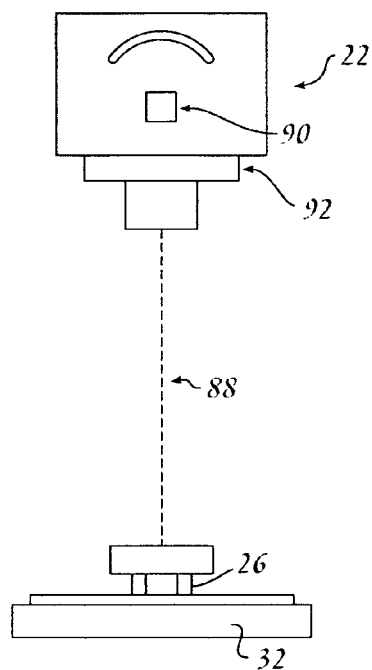
FIG. 11 is a simplified plan view of a radiation source employed in the lithographic system shown in FIG. 1, depicting single radiation source.

Referring to FIG. 11, alternatively, radiation source 22 may include a single radiation source that produces multiple ranges of wavelength, which may be selectively controlled to impinge upon substrate 32 sequentially or concurrently. An exemplary radiation source 22 consists of a single broad spectrum radiation source 90 that produces UV and IR radiation, which may consist of a mercury (Hg) lamp. To selectively impinge differing types of radiation upon substrate 32, a filtering system 92 is utilized. Filtering system 92 comprises a high pass filter (not shown) and a low pass filter (not shown), each in optical communication with radiation source 90. Filtering system 92 may position the high pass filter (not shown) such that optical path 88 comprises IR radiation or filtering system 92 may position the low pass filter (not shown) such that optical path 88 comprises UV radiation. The high pass and low pass filters (not shown) may be any known in the art, such as interference filters comprising two semi-reflective coatings with a spacer disposed therebetween. The index of refraction and the thickness of the spacer determine the frequency band being selected and transmitted through the interference filter. Therefore, the appropriate index of refraction and thickness of the spacer is chosen for both the high pass filter (not shown) and the low pass filter (not shown), such that the high pass filter (not shown) permits passage of IR radiation and the low pass filter (not shown) permits passage of UV radiation. A processor (not shown) is in data communication with radiation source 90 and filtering system 92 to selectively allow the desired wavelength of radiation to propagate along optical path 88. The circuit enables high pass filter (not shown) when IR radiation is desired and enables the low pass filter (not shown) when UV radiation is desired.

Figure 12:
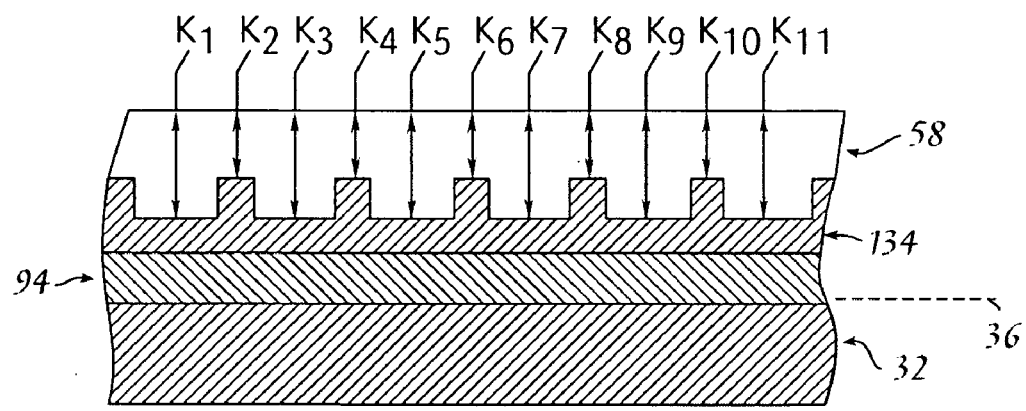
FIG. 12 is a cross-sectional view of a substrate shown in FIGS. 1, 2, 5, 6, 7 and 8 showing an infra-red absorption layer in accordance with the present invention.

Referring to FIG. 12, substrate 32 may have one or more existing layers disposed thereon before deposition of imprinting layer 34. As a result, heating the silicon-containing material may be problematic, because the material from which the wafer is formed and/or the preexisting layers on the wafer, e.g., solidified imprinting layer 134, are substantially non-responsive to infrared radiation. As a result, very little energy transfer may occur, resulting in it being difficult to raise the temperature of the silicon-containing material sufficient to achieve cross-linking.

To facilitate cross-linking of the silicon-containing material in conformal layer 58, one of the layers included with substrate 32 may be an infrared absorption layer 94. Absorption layer 94 comprises a material that is excited when exposed to IR radiation and produces a localized heat source. Typically, absorption layer 94 is formed from a material that maintains a constant phase state during the heating process, which may include a solid phase state. Specifically, the IR radiation impinging upon absorption layer 94 causes an excitation of the molecules contained therein, generating heat. The heat generated in absorption layer 94 is transferred to the silicon-containing material via conduction through the wafer and/or any intervening layer of material thereon, e.g., absorption layer 94 may be disposed on surface 36 so as to be disposed between substrate 32 and solidified imprinting layer 134. As a result, absorption layer 94 and substrate 32 provide a bifurcated heat transfer mechanism that is able to absorb IR radiation and to produce a localized heat source sensed by the silicon-containing material in conformal layer 58. In this manner, absorption layer 94 creates a localized heat sources on surface 36. To that end, absorption layer 94 may be deposited using any known technique, including spin-coating, chemical vapor deposition, physical vapor deposition, atomic layer deposition and the like. Exemplary materials that may be formed from a carbon based PVD coating, organic thermo set coating with carbon black filler or molybdenum disulfide ($MoS_2$) based coating.

Figure 13:
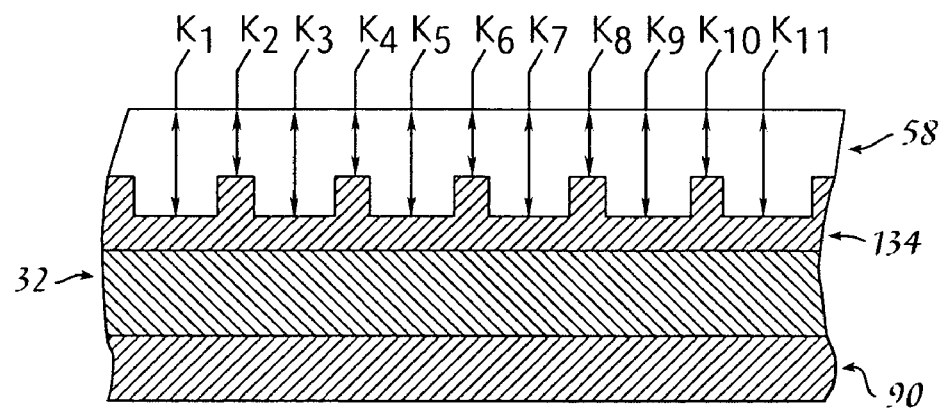
FIG. 13 is a cross-sectional view of a substrate shown in FIGS. 1, 2, 5, 6, 7 and 8 showing an infra-red absorption layer in accordance with an alternate embodiment of the present invention.

Referring to FIG. 13, absorption layer 94 may be disposed on a side of substrate 32 disposed opposite to solidified imprinting layer 134. As a result, absorption layer 94 may be permanently or removably attached. Exemplary materials that may be employed as absorption layer 94 include black nickel and anodized black aluminum. Also, black chromium may be employed as absorption layer 94. Black chromium is typically deposited as a mixture of oxides and is used as a coating for solar cells.

Furthermore, as shown in FIG. 2, patterned mold 26 may be fabricated from any material, such as, but not limited to, fused-silica, quartz, silicon, organic polymers, siloxane polymers, borosilicate glass, fluorocarbon polymers, metal, and combinations of the above. However, it the present embodiment, the actinic radiation propagates through patterned mold 26. Therefore, it is desired that patterned mold 26 be fabricated from material that is substantially transparent to the actinic radiation. The plurality of features on patterned mold 26 are shown as recesses 28 extending along a direction parallel to projections 30 that provide a cross-section of patterned mold 26 with a shape of a battlement. However, recesses 28 and projections 30 may correspond to virtually any feature required to create an integrated circuit and may be as small as a few tenths of nanometers.

Figure 14:
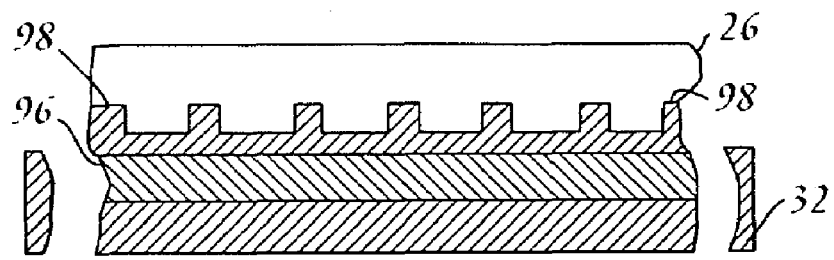
FIG. 14 is a cross-section view showing a release layer and a planarization layer that may be employed in accordance with the present invention.

Referring to FIGS. 2 and 14, similarly, it may be desirable to provide substrate 32 with a planarized surface upon which to forming imprinting layer 34. To that end, a primer layer 96 may be formed upon substrate 32. Primer layer 96 has proved beneficial when surface 36 of substrate 32 appears rough when compared to the features dimensions to be formed in imprinting layer 34. Additionally, it has been found beneficial to deposit primer layer 96 when forming imprinting layer 34 upon a previously disposed patterned layer present on substrate 32. Primer layer 96 may also functions, inter alia, to provide a standard interface with imprinting layer 34, thereby reducing the need to customize each process to the material from which substrate 32 is formed. In addition, primer layer 96 may be formed from an organic material with the same etch characteristics as imprinting layer 34. Primer layer 96 is fabricated in such a manner so as to possess a continuous, smooth, relatively defect-free surface that may exhibit excellent adhesion to imprinting layer 34. An exemplary material to use to form primer layer 96 is available from Brewer Science, Inc. of Rolla Mo. under the trade name DUV30J-6.

Figure 15:
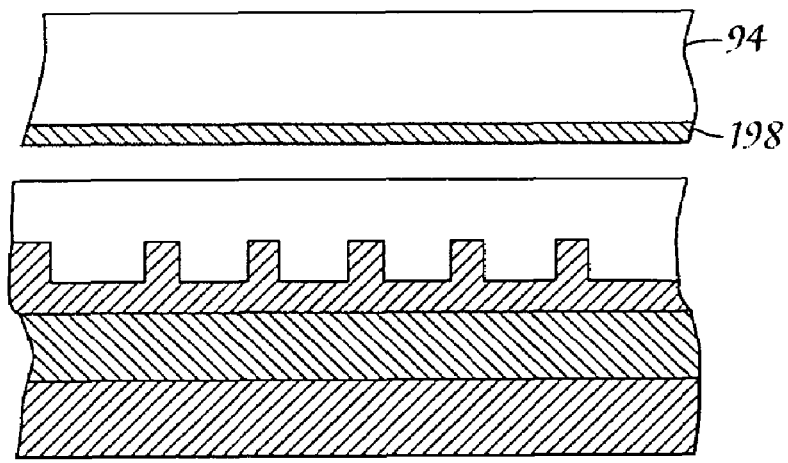
FIG. 15 is a cross-section view showing a release layer applied to a planarization mold shown in FIG. 13.

Referring to FIGS. 5 and 14, to reduce the probability that solidified imprinting layer 134 does not adhere to patterned mold 26, surface 50 may be treated with a low surface energy coating 98. Low surface energy coating 98 may be applied using any known process. For example, processing techniques may include chemical vapor deposition method, physical vapor deposition, atomic layer deposition or various other techniques, brazing and the like. In a similar fashion a low surface energy coating 198 may be applied to planarizing mold 94, shown in FIG. 15. Typically, the surfactant has a surface energy associated therewith that is lower than a surface energy of the polymerizable material in the layer. An exemplary material and process by which to form the aforementioned surfactant is discussed by Bender et al. in MULTIPLE IMPRINTING IN UV-BASED NANOIMPRINT LITHOGRAPHY: RELATED MATERIAL ISSUES, Microelectronic Engineering pp. 61–62 (2002). The low surface energy of the surfactant provides the desired release properties to reduce adherence of either imprinting layer 34 or conformal layer 58 to patterned mold 26. It should be understood that the surfactant may be used in conjunction with, or in lieu of, low surface energy coatings 98 and 198.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A composition for forming a layer on a surface, said composition comprising:
   hydroxyl-functional polysiloxane;
   hexamethoxymethylmelamine;
   toluenesulfonic acid; and
   methyl amyl ketone.

2. The composition as recited in claim 1 wherein said hydroxyl-functional polysiloxane is approximately 4% of said composition, said hexamethoxymethylmelamine is approximately 0.95% of said composition, said toluenesulfonic acid is approximately 0.05% of said composition, and said methyl amyl ketone is approximately 95% of said composition.

3. The composition as recited in claim 1 further including gamma-glycidoxypropyltrimethoxysilane.

4. The composition as recited in claim 3 wherein said hydroxyl-functional polysiloxane is approximately 4% of said composition, said hexamethoxymethylmelamine is approximately 0.7% of said composition, said gamma-glycidoxypropyltrimethoxysilane is approximately 0.25% of said composition, said toluenesulfonic acid is approximately 0.05% of said composition, and said methyl amyl ketone is approximately 95% of said composition.

5. The composition as recited in claim 1 wherein relative proportions of said hydroxyl-functional polysiloxane, hexamethoxymethylmelamine, gamma-glycidoxypropyltrimethoxysilane, said toluenesulfonic acid, and methyl amyl ketone provides said composition with approximately 20% by weight of silicon atoms upon transitioning from a liquid state to a solidified state.

* * * * *